United States Patent  (10) Patent No.: US 11,495,661 B2
Lee et al.  (45) Date of Patent: Nov. 8, 2022

(54) SEMICONDUCTOR DEVICE INCLUDING GATE BARRIER LAYER

(71) Applicant: Taiwan Semiconductor Manufacturing Co., Ltd., Hsinchu (TW)

(72) Inventors: Hsin-Yi Lee, Hsinchu (TW); Ji-Cheng Chen, Hsinchu (TW); Cheng-Lung Hung, Hsinchu (TW); Weng Chang, Hsinchu (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 77 days.

(21) Appl. No.: 16/842,066

(22) Filed: Apr. 7, 2020

(65) Prior Publication Data

US 2021/0313419 A1  Oct. 7, 2021

(51) Int. Cl.
*H01L 29/06* (2006.01)
*H01L 21/02* (2006.01)
(Continued)

(52) U.S. Cl.
CPC ...... *H01L 29/0673* (2013.01); *H01L 21/0245* (2013.01); *H01L 21/0262* (2013.01); *H01L 21/02178* (2013.01); *H01L 21/02186* (2013.01); *H01L 21/02458* (2013.01); *H01L 29/0638* (2013.01); *H01L 29/0676* (2013.01);
(Continued)

(58) Field of Classification Search
CPC ..... H01L 29/0669–068; H01L 29/0665; H01L 2924/13061; H01L 29/66439; H01L 29/66469; H01L 29/7853–2029/7858; H01L 29/78687; H01L 29/78696; H01L 29/42392; H01L 29/4925–4941; H01L 29/4958; H01L 29/435; H01L 29/495–4958; H01L 29/4966–4975; H01L 21/28061; H01L 21/28079–28088;
(Continued)

(56) References Cited

U.S. PATENT DOCUMENTS 9,209,247 B2  12/2015  Colinge et al.
9,236,267 B2  1/2016  De et al.
(Continued)

FOREIGN PATENT DOCUMENTS

KR  20150033496 A  4/2015
KR  20190024600 A  3/2019
(Continued)

*Primary Examiner* — Scott B Geyer
(74) *Attorney, Agent, or Firm* — Slater Matsil, LLP

(57) ABSTRACT

A semiconductor device including a barrier layer surrounding a work function metal layer and methods of forming the same are disclosed. In an embodiment, a semiconductor device includes a semiconductor substrate; a first channel region over the semiconductor substrate; a second channel region over the first channel region; gate dielectric layers surrounding the first channel region and the second channel region; work function metal layers surrounding the gate dielectric layers; and barrier layers surrounding the work function metal layers, a first barrier layer surrounding the first channel region being merged with a second barrier layer surrounding the second channel region.

20 Claims, 24 Drawing Sheets

(51) Int. Cl.
*H01L 29/423* (2006.01)
*H01L 29/49* (2006.01)

(52) U.S. Cl.
CPC .... *H01L 29/42392* (2013.01); *H01L 29/4925* (2013.01); *H01L 29/4958* (2013.01); *H01L 29/4966* (2013.01); *H01L 29/4975* (2013.01)

(58) Field of Classification Search
CPC ....... H01L 21/32051–32053; H01L 29/66515; H01L 21/28097
See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,704,995 B1* | 7/2017 | Schultz | H01L 29/775 |
| 9,997,519 B1* | 6/2018 | Bao | H01L 29/4966 |
| 10,134,640 B1* | 11/2018 | Chiang | H01L 21/823878 |
| 10,211,322 B1* | 2/2019 | Kim | B82Y 10/00 |
| 10,319,846 B1* | 6/2019 | Ando | H01L 29/401 |
| 10,381,439 B2 | 8/2019 | Tung | |
| 10,403,550 B2 | 9/2019 | Chiang et al. | |
| 10,510,620 B1* | 12/2019 | Chanemougame | H01L 29/0692 |
| 10,700,064 B1* | 6/2020 | Zhang | H01L 29/4966 |
| 2017/0110542 A1* | 4/2017 | Lee | H01L 29/78696 |
| 2018/0158836 A1* | 6/2018 | Kim | H01L 29/78696 |
| 2018/0226484 A1 | 8/2018 | Bao et al. | |
| 2019/0081148 A1* | 3/2019 | Chung | H01L 29/42392 |
| 2019/0081152 A1* | 3/2019 | Suh | H01L 21/28088 |
| 2019/0326286 A1* | 10/2019 | Xie | H01L 29/401 |
| 2019/0371903 A1* | 12/2019 | Bao | H01L 21/02603 |
| 2020/0035678 A1* | 1/2020 | Lee | B82Y 10/00 |
| 2020/0035842 A1* | 1/2020 | Kim | H01L 27/092 |
| 2020/0043808 A1* | 2/2020 | Bao | H01L 21/3215 |
| 2020/0058653 A1* | 2/2020 | Chiang | H01L 21/823821 |
| 2020/0091009 A1* | 3/2020 | Cheng | H01L 21/02532 |
| 2020/0098897 A1* | 3/2020 | Tapily | H01L 21/823814 |
| 2020/0144255 A1* | 5/2020 | Lee | H01L 29/42392 |
| 2020/0294865 A1* | 9/2020 | Cheng | H01L 29/42392 |
| 2020/0365584 A1* | 11/2020 | Ando | H01L 29/0649 |
| 2020/0373300 A1* | 11/2020 | Zhang | H01L 29/78696 |
| 2020/0381311 A1* | 12/2020 | Kim | H01L 29/78696 |
| 2021/0118883 A1* | 4/2021 | Lim | H01L 21/823828 |

FOREIGN PATENT DOCUMENTS

| | | |
|---|---|---|
| TW | 201736249 A | 10/2017 |
| TW | 202013531 A | 4/2020 |

* cited by examiner

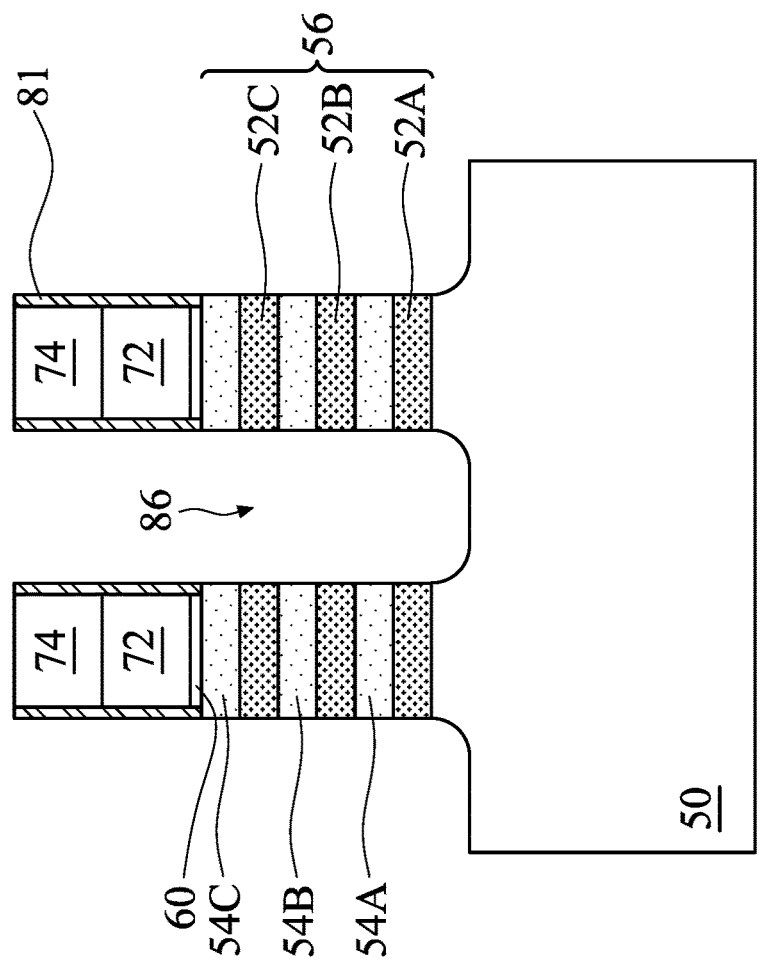
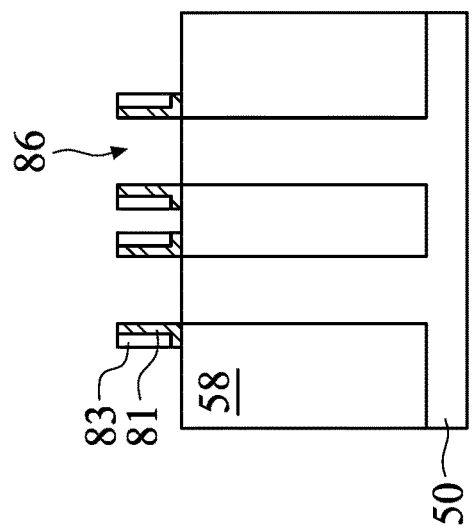
Figure 9B
Figure 9A

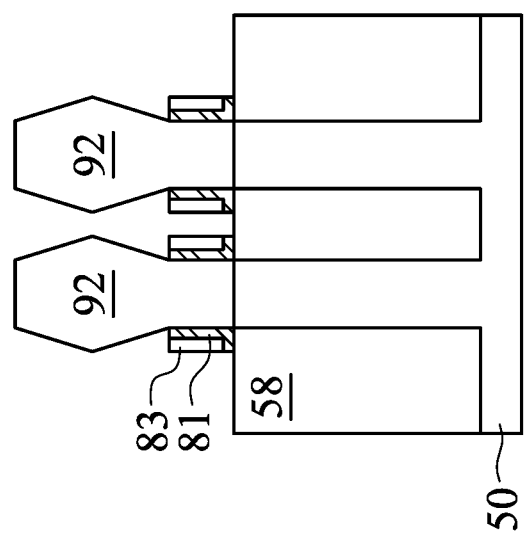

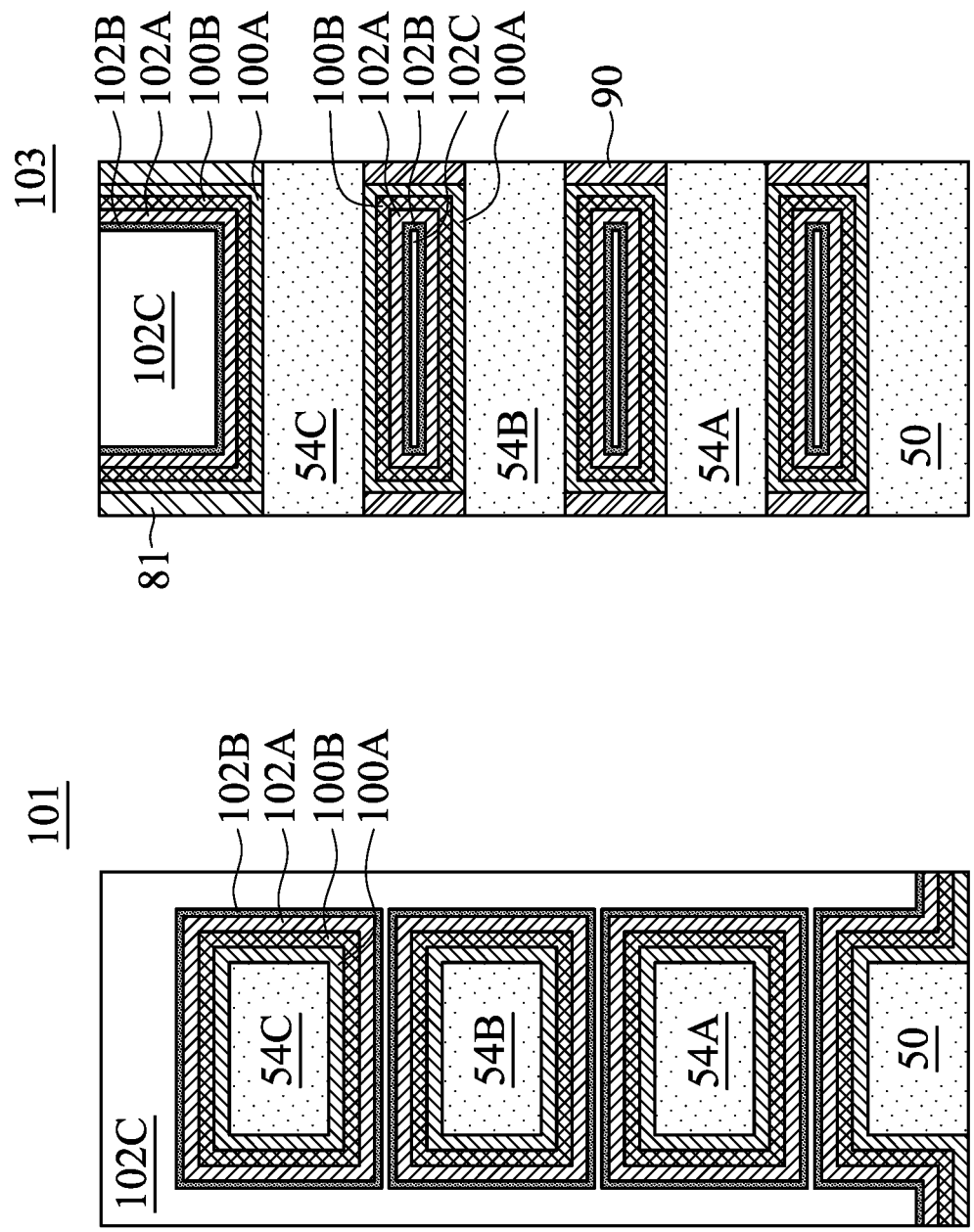

SEMICONDUCTOR DEVICE INCLUDING GATE BARRIER LAYER

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 8A, 8B, 9A, 9B, 10A, 10B, 11A, 11B, 12A, 12B, 12C, 13A, 13B, 14A, 14B, 15A, 15B, 16A, 16B, 17A, 17B, 17C, 17D, 18A, 18B, 19A, 19B, 20A, 20B, 21A, and 21B are cross-sectional views of intermediate stages in the manufacturing of semiconductor devices, in accordance with some embodiments.

DETAILED DESCRIPTION

Figure 1:
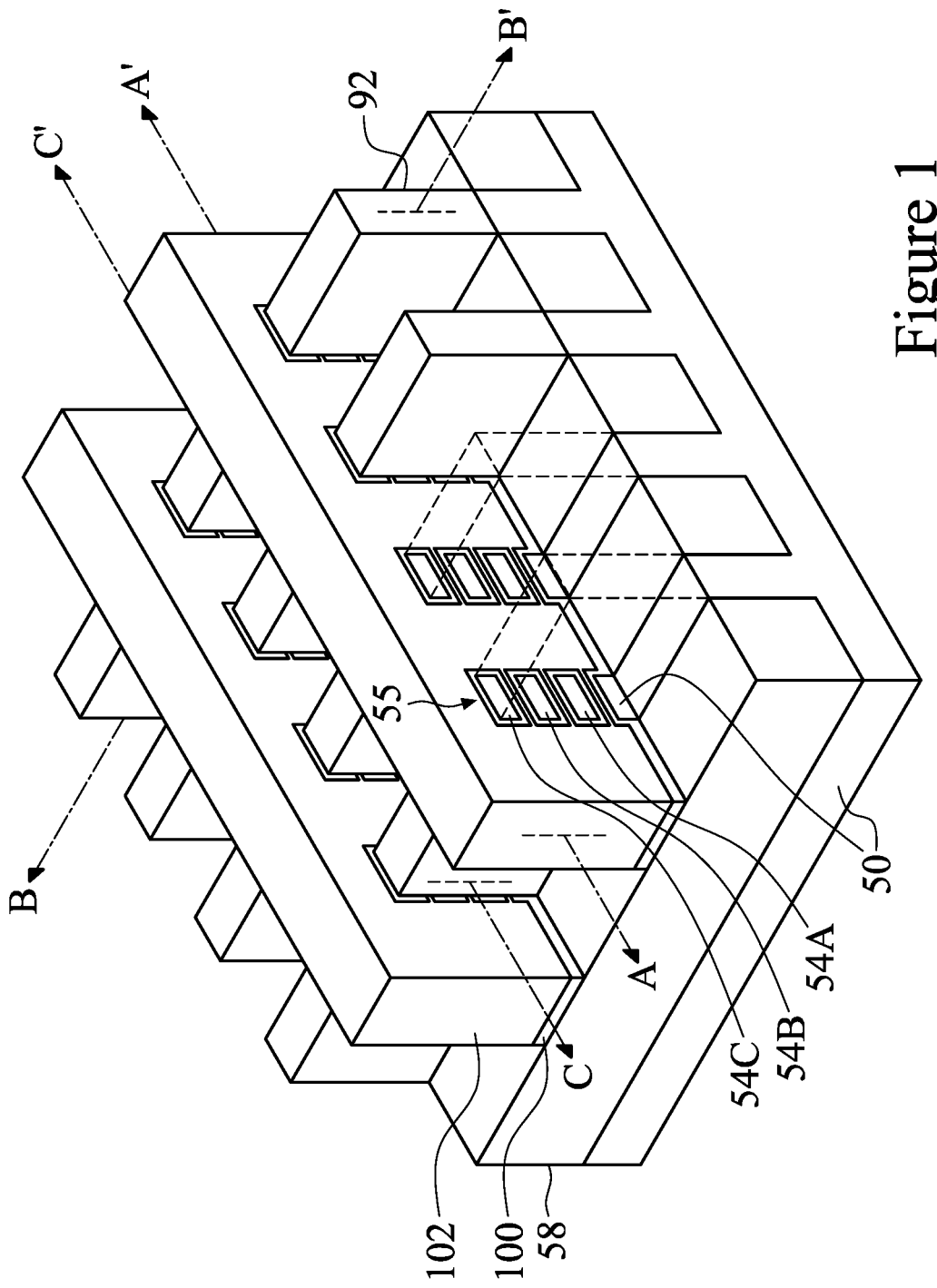
FIG. 1 illustrates an example of a semiconductor device including nanosheet field-effect transistors (NSFETs) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide semiconductor devices and methods of forming the same in which a barrier layer is formed between a work function metal layer and a fill material in a gate electrode. The barrier layer may be included to prevent metal from migrating from a work function metal layer deposited on a first channel region to a high-k layer deposited on an adjacent second channel region and from a work function metal layer deposited on the second channel region to a high-k layer deposited on the first channel region. The barrier layer may further prevent work function metal layers deposited on the first channel region and the second channel region from merging, which helps to ensure that thicknesses of the work function metal layers are the same around the perimeter of the first channel region and the second channel region. The barrier layer may be included in gate electrodes in both NMOS regions and PMOS regions of semiconductor devices. In some embodiments, barrier layers disposed in the NMOS regions may be formed of silicon, silicon oxide, or the like and barrier layers disposed in the PMOS regions may be formed of tantalum nitride, tungsten nitride, tungsten carbonitride, or the like. By preventing migration of metal within gate stacks (including the high-k layer, the work function metal layer, the barrier layer, and the fill material), the barrier layer reduces device defects and improves device performance. Moreover, because the work function metal layers have even thicknesses around the perimeter of channel regions, electrical performance is improved and device defects are reduced.

FIG. 1 illustrates an example of nanostructure (e.g., nanosheet, nanowire, gate-all-around, or the like) field effect transistors (NSFETs), in accordance with some embodiments. The NSFETs comprise nanostructures 55 over a substrate 50 (e.g., a semiconductor substrate). The nanostructures 55 include second semiconductor layers 54A-54C, which act as channel regions of the nanostructures 55. Shallow trench isolation (STI) regions 58 are disposed in the substrate 50, and the nanostructures 55 are disposed above and between neighboring STI regions 58. Although the STI regions 58 are described/illustrated as being separate from the substrate 50, as used herein, the term "substrate" may refer to the semiconductor substrate alone or a combination of the semiconductor substrate and the STI regions.

Gate dielectric layers 100 are along top surfaces, sidewalls, and bottom surfaces of the nanostructures 55, such as on top surfaces, sidewalls, and bottom surfaces of each of the second semiconductor layers 54A-54C, and along top surfaces and sidewalls of portions of the substrate 50. Gate electrodes 102 are over the gate dielectric layers 100. Epitaxial source/drain regions 92 are disposed on opposite sides of the nanostructures 55, the gate dielectric layers 100, and the gate electrodes 102. FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of the NSFETs. Cross-section B-B' is perpendicular to cross-section A-A' and is along a longitudinal axis of a nanostructure 55 and in a direction of, for example, the current flow between the epitaxial source/drain regions 92 of the NSFETs. Cross-section C-C' is parallel to cross-section A-A' and extends through the epitaxial source/drain regions 92 of the NSFETs. Subsequent figures refer to these reference cross-sections for clarity.

Some embodiments discussed herein are discussed in the context of NSFETs formed using gate-last processes. In other embodiments, a gate-first process may be used. Also, some embodiments contemplate aspects used fin field effect transistors (FinFETs) or planar devices, such as planar FETs.

FIGS. 2 through 21B are cross-sectional views of intermediate stages in the manufacturing of NSFETs, in accordance with some embodiments. FIGS. 2 through 5, 6A, 13A, 14A, 15A, 16A, 17A, 17C, 18A, 19A, 20A, and 21A illustrate reference cross-section A-A' illustrated in FIG. 1. FIGS. 6B, 7B, 8B, 9B, 10B, 11B, 12B, 13B, 14B, 15B, 16B, 17B, 17D, 18B, 19B, 20B, and 21B illustrate reference cross-section B-B' illustrated in FIG. 1. FIGS. 7A, 8A, 9A, 10A, 11A, 12A, and 12C illustrate reference cross-section C-C' illustrated in FIG. 1.

Figure 2:
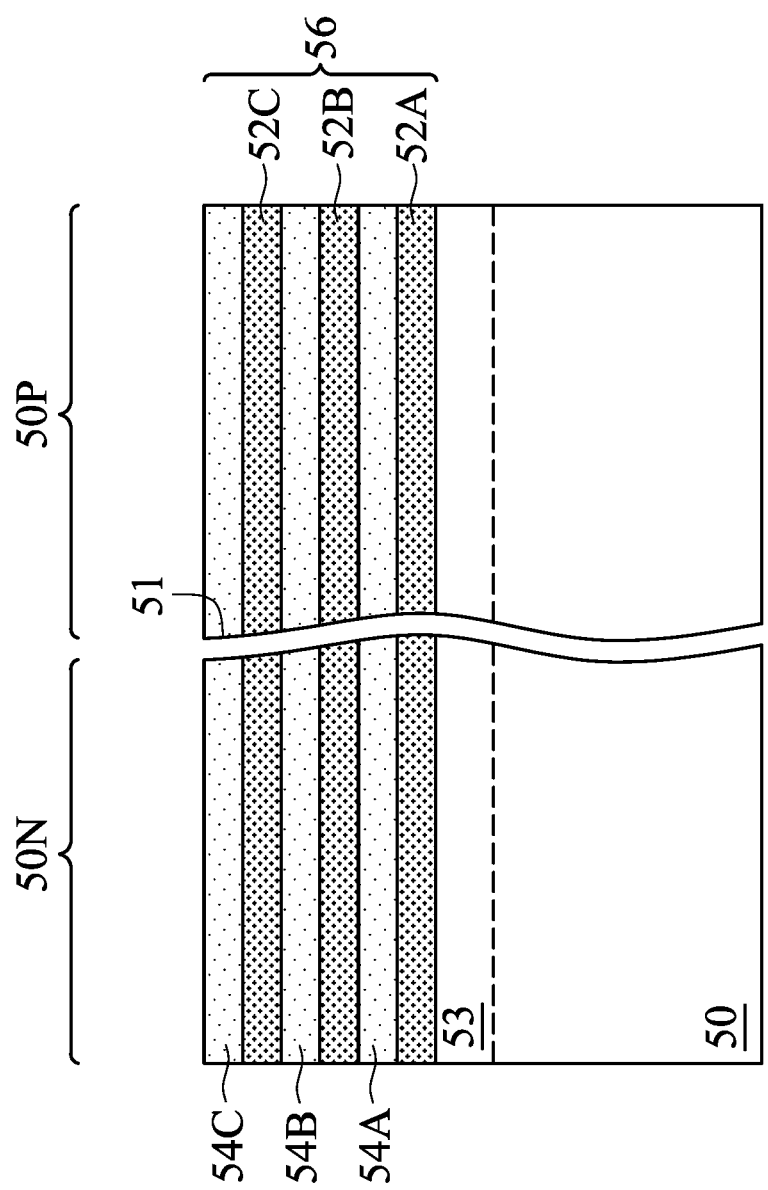

In FIG. 2, a substrate 50 is provided for forming NSFETs. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type NSFETs. The region 50P can be for forming p-type devices, such as PMOS transistors, e.g., p-type NSFETs. The region 50N may be physically separated from the region 50P (as illustrated by divider 51), and any number of device features (e.g., other active devices, doped regions, isolation structures, etc.) may be disposed between the region 50N and the region 50P.

The substrate 50 may be lightly doped with a p-type or an n-type impurity. An anti-punch-through (APT) implantation may be performed on an upper portion of the substrate 50 to form an APT region 53. During the APT implantation, dopants may be implanted in the region 50N and the region 50P. The dopants may have a conductivity type opposite a conductivity type of source/drain regions (such as the epitaxial source/drain regions 92, discussed below with respect to FIGS. 12A-12C) to be formed in each of the region 50N and the region 50P. The APT region 53 may extend under the subsequently formed source/drain regions in the resulting NSFETs, which will be formed in subsequent processes. The APT region 53 may be used to reduce the leakage from the source/drain regions to the substrate 50. In some embodiments, the doping concentration in APT region 53 may be from about $1 \times 10^{18}$ atoms/cm$^3$ to about $1 \times 10^{19}$ atoms/cm$^3$, such as about $5.5 \times 10^{18}$ atoms/cm$^3$. For simplicity and legibility, the APT region 53 is not illustrated in subsequent drawings.

Further in FIG. 2, a multi-layer stack 56 is formed over the substrate 50. The multi-layer stack 56 includes alternating first semiconductor layers 52 and second semiconductor layers 54 of different semiconductor materials. The first semiconductor layers 52 may be formed of first semiconductor materials, which may include, for example, silicon germanium (SiGe) or the like. The second semiconductor layers 54 may be formed of second semiconductor materials, which may include, for example, silicon (Si), silicon carbon (SiC), or the like. In other embodiments, the first semiconductor layers 52 may be formed of the second semiconductor materials and the second semiconductor layers 54 may be formed of the first semiconductor materials. For purposes of illustration, the multi-layer stack 56 includes three of the first semiconductor layers 52 (e.g., first semiconductor layers 52A-52C) and three of the second semiconductor layers 54 (e.g., second semiconductor layers 54A-54C). In other embodiments, the multi-layer stack 56 may include any number of the first semiconductor layers 52 and the second semiconductor layers 54. Each of the layers of the multi-layer stack 56 may be epitaxially grown using a process such as chemical vapor deposition (CVD), atomic layer deposition (ALD), vapor phase epitaxy (VPE), molecular beam epitaxy (MBE), or the like. In some embodiments, a ratio of a thickness of the second semiconductor layers 54 to a thickness of the first semiconductor layers 52 may be from about 0.5 to about 0.9, such as about 0.7.

For purposes of illustration, the second semiconductor layers 54 will be described as forming channel regions in completed NSFET devices. The first semiconductor layers 52 may be sacrificial layers, which may be subsequently removed. Nevertheless, in some embodiments the first semiconductor layers 52A-52C may form channel regions in completed NSFET devices, while the second semiconductor layers 54A-54C may be sacrificial layers.

Figure 3:
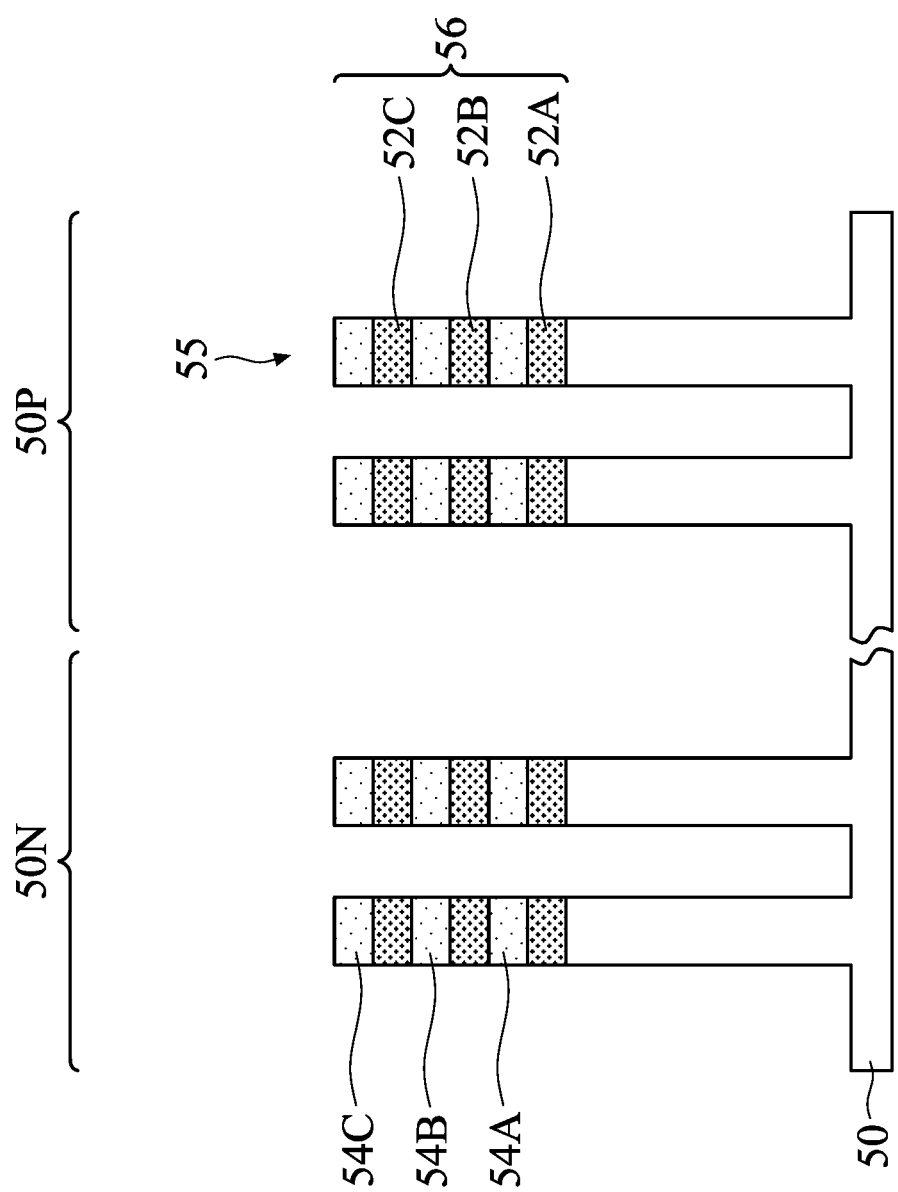

In FIG. 3, nanostructures 55 are formed in the multi-layer stack 56 and the substrate 50 is etched. In some embodiments, the nanostructures 55 may be formed by etching trenches in the multi-layer stack 56 and the substrate 50. The etching may be any acceptable etch process, such as a reactive ion etch (RIE), neutral beam etch (NBE), the like, or a combination thereof. The etching may be anisotropic.

The nanostructures 55 and the substrate 50 may be patterned by any suitable method. For example, the nanostructures 55 and the substrate 50 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructures 55 and the substrate 50. In some embodiments, a mask (or other layer) may remain on the nanostructures 55 after patterning the nanostructures 55 and the substrate 50.

Figure 4:
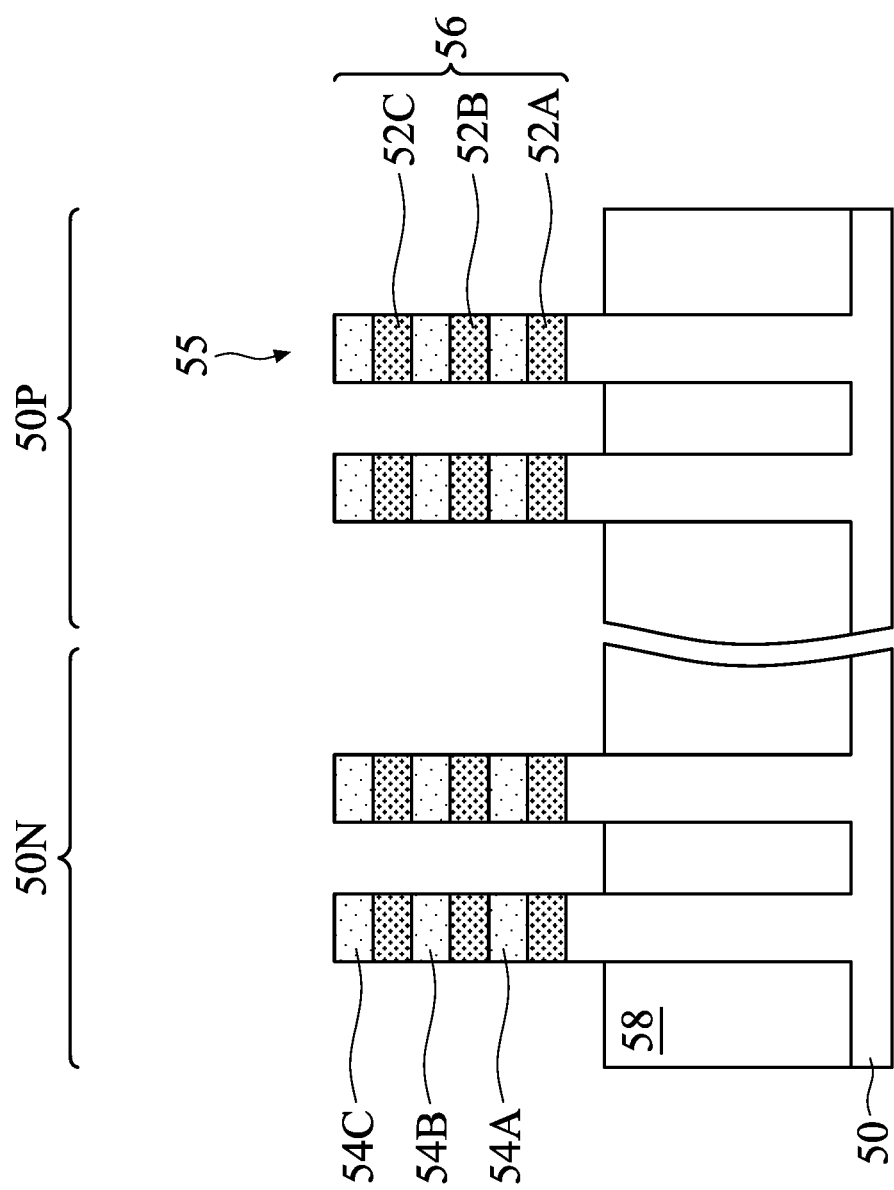

In FIG. 4, shallow trench isolation (STI) regions 58 are formed adjacent the nanostructures 55 and the patterned portions of the substrate 50. The STI regions 58 may be formed by forming an insulation material (not separately illustrated) over the substrate 50 and between neighboring nanostructures 55/patterned portions of the substrate 50. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system with post curing to convert the deposited material to another material, such as an oxide), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. The insulation material may comprise a single layer or may utilize multiple layers. For example, in some embodiments a liner (not separately illustrated) may first be formed along surfaces of the substrate 50 and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process may planarize the insulation material and the nanostructures 55. The planarization process exposes the nanostructures 55 such that top surfaces of the nanostructures 55 and the insulation material are level after the planarization process is complete.

The insulation material is then recessed to form the STI regions 58 as illustrated in FIG. 4. The insulation material is recessed such that upper portions of the nanostructures 55 and the substrate 50 protrude from between neighboring STI regions 58. Further, the top surfaces of the STI regions 58 may have flat surfaces as illustrated, convex surfaces, concave surfaces (such as dishing), or a combination thereof. The top surfaces of the STI regions 58 may be formed flat, convex, and/or concave by an appropriate etch. The STI regions 58 may be recessed using an acceptable etching process, such as one that is selective to the material of the insulation material (e.g., etches the material of the insulation material at a faster rate than the material of the nanostructures 55 and the substrate 50). For example, an oxide removal using, for example, dilute hydrofluoric (dHF) acid may be used.

The process described with respect to FIGS. 2-4 is just one example of how the nanostructures 55. In some embodiments, the nanostructures 55 may be formed by epitaxial growth processes. For example, dielectric layers may be formed over top surfaces of the substrate 50, and trenches may be etched through the dielectric layers to expose the underlying substrate 50. Epitaxial structures may be epitaxially grown in the trenches, and the dielectric layers may be recessed such that the epitaxial structures protrude from the dielectric layer to form the nanostructures 55. In the nanostructures 55, the epitaxial structures may comprise alternating layers of the first semiconductor materials and the second semiconductor materials. The substrate 50 may include epitaxial structures, which may be homoepitaxial structures or heteroepitaxial structures. The dielectric layers may be subsequently recessed such that the nanostructures 55 and portions of the substrate 50 protrude from the dielectric layer. In embodiments where the nanostructures 55 and portions of the substrate 50 are epitaxially grown, the epitaxially grown materials may be in situ doped during growth, which may obviate prior and subsequent implantations, although in situ and implantation doping may be used together.

Still further, it may be advantageous to epitaxially grow material in the region 50N (e.g., the NMOS region) different from the materials in the region 50P (e.g., the PMOS region). In various embodiments, upper portions of the substrate 50 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 4, appropriate wells (not separately illustrated) may be formed in the nanostructures 55 and/or the substrate 50. In some embodiments, P wells may be formed in the region 50N, and N wells may be formed in the region 50P. In further embodiments, P wells or N wells may be formed in each of the region 50N and the region 50P.

In embodiments including different well types, different implant steps for the region 50N and the region 50P may be achieved using a photoresist or other masks (not separately illustrated). For example, a photoresist may be formed over the nanostructures 55, the substrate 50, and the STI regions 58 in the region 50N. The photoresist is patterned to expose the region 50P of the substrate 50. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N. The n-type impurities may be phosphorus, arsenic, antimony, or the like implanted in the region to a concentration of equal to or less than $1 \times 10^{18}$ atoms/cm$^3$, such as from about $1 \times 10^{16}$ atoms/cm$^3$ to about $1 \times 10^{18}$ atoms/cm$^3$, or about $5.05 \times 10^{17}$ atoms/cm$^3$. After the implant, the photoresist is removed, such as by an acceptable ashing process.

Following the implanting of the region 50P, a photoresist is formed over the nanostructures 55, the substrate 50, and the STI regions 58 in the region 50P. The photoresist is patterned to expose the region 50N of the substrate 50. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P. The p-type impurities may be boron, boron fluoride, indium, or the like implanted in the region to a concentration of equal to or less than $1 \times 10^{18}$ atoms/cm$^3$, such as from about $1 \times 10^{16}$ atoms/cm$^3$ to about $1 \times 10^{18}$ atoms/cm$^3$, or about $5.05 \times 10^{17}$ atoms/cm$^3$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
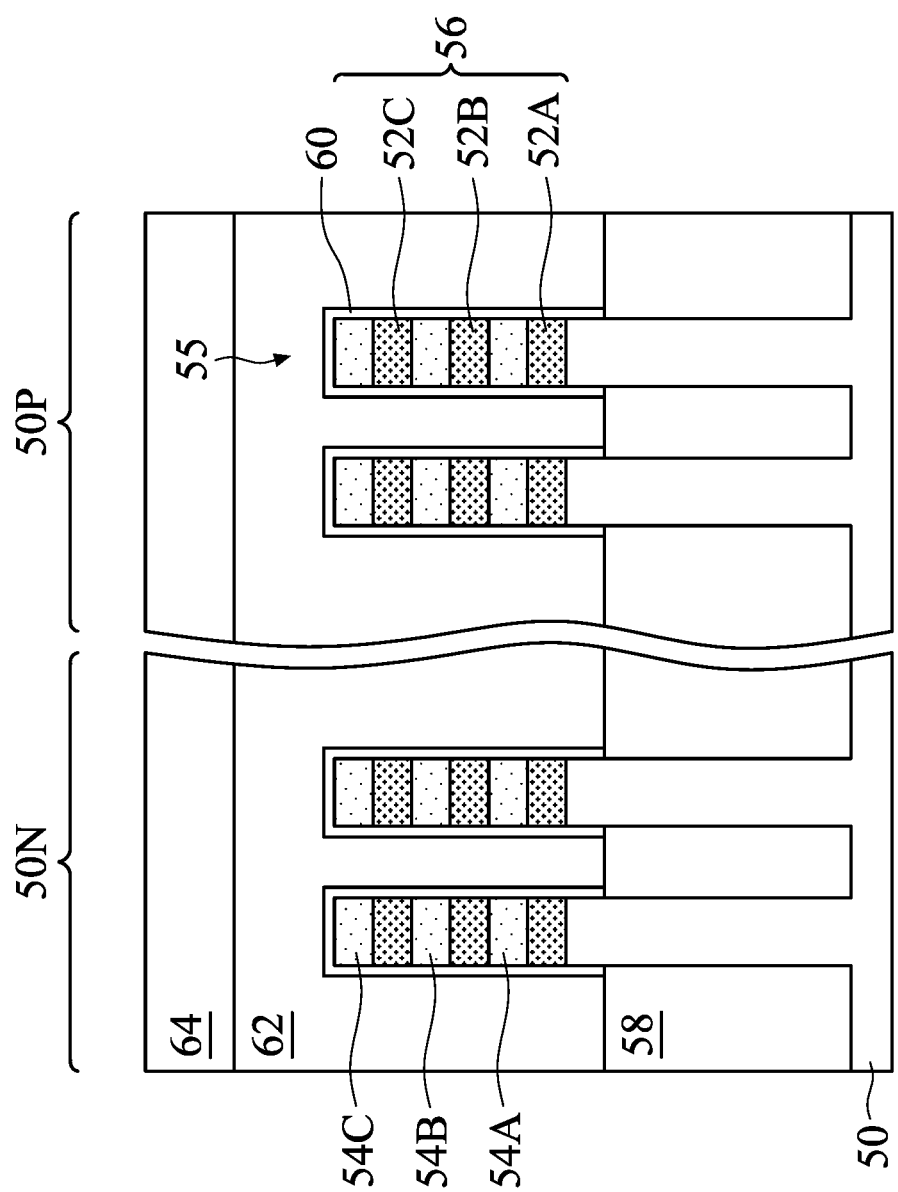

In FIG. 5, dummy dielectric layers 60 are formed on the nanostructures 55 and the substrate 50. The dummy dielectric layers 60 may be, for example, silicon oxide, silicon nitride, a combination thereof, or the like, and may be deposited or thermally grown according to acceptable techniques. A dummy gate layer 62 is formed over the dummy dielectric layers 60, and a mask layer 64 is formed over the dummy gate layer 62. The dummy gate layer 62 may be deposited over the dummy dielectric layers 60 and then planarized by a process such as CMP. The mask layer 64 may be deposited over the dummy gate layer 62. The dummy gate layer 62 may be conductive or non-conductive materials and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the material of the STI regions 58. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layers 60 are shown covering only the nanostructures 55 and the substrate 50 for illustrative purposes only. In some embodiments, the dummy dielectric layers 60 may be deposited such that the dummy dielectric layers 60 cover the STI regions 58, extending between the dummy gate layer 62 and the STI regions 58.

FIGS. 6A through 21B illustrate various additional steps in the manufacturing of embodiment devices. FIGS. 6B through 21B illustrate features in either of the region 50N or the region 50P. For example, the structures illustrated in FIGS. 6B through 21B may be applicable to both the region 50N and the region 50P. Differences (if any) in the structures of the region 50N and the region 50P are described in the text accompanying each figure.

Figure 6A:
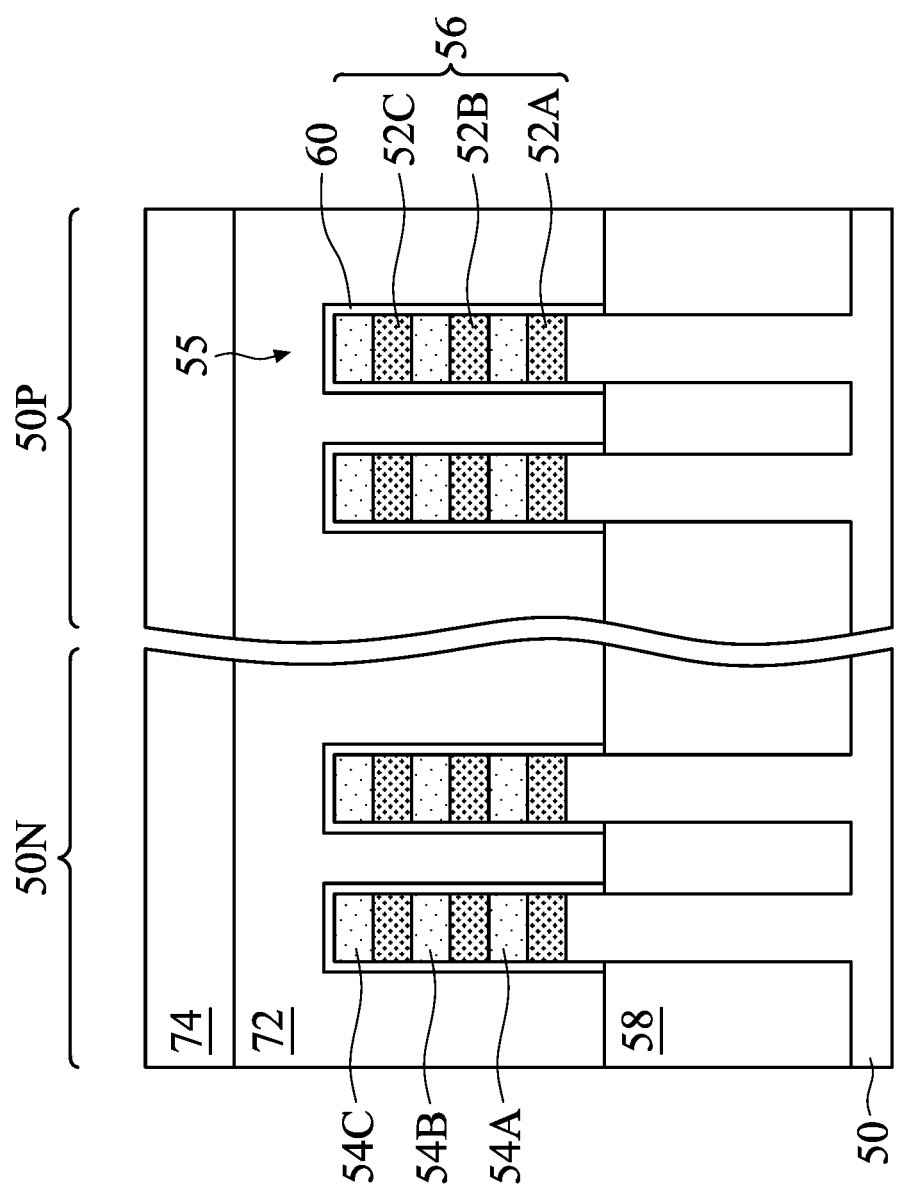
Figure 6B:
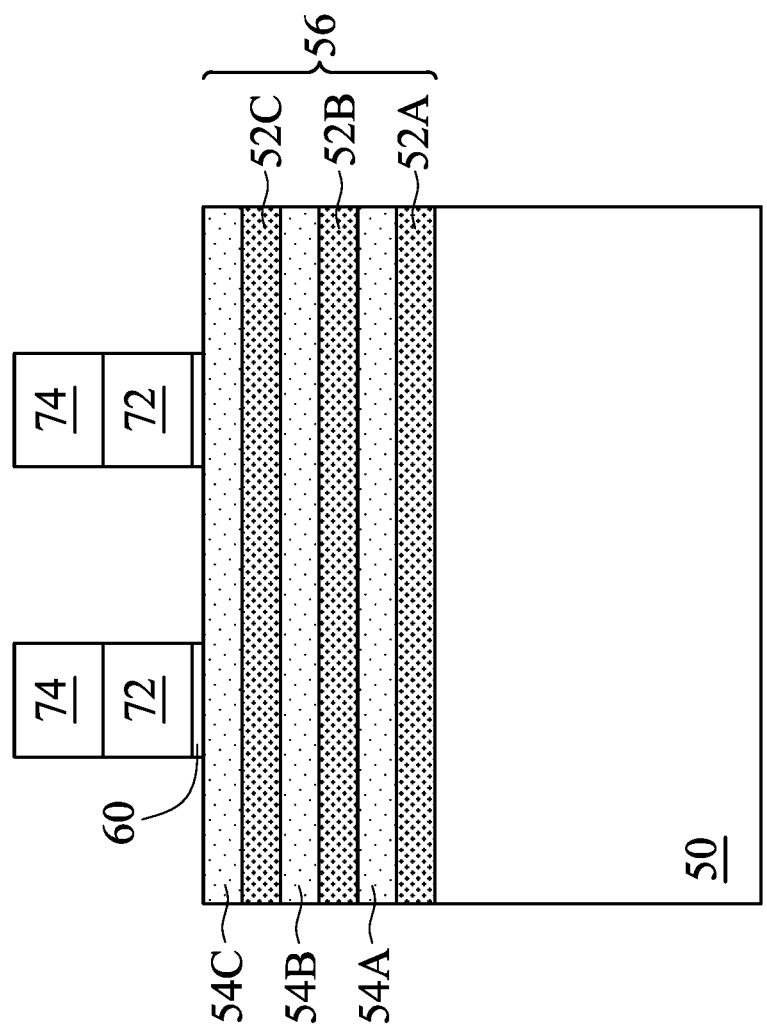

In FIGS. 6A and 6B, the mask layer 64 (see FIG. 5) may be patterned using acceptable photolithography and etching techniques to form masks 74. An acceptable etching technique may be used to transfer the pattern of the masks 74 to the dummy gate layer 62 to form dummy gates 72. In some embodiments, the pattern of the masks 74 may also be transferred to the dummy dielectric layers 60. The dummy gates 72 cover respective channel regions of the nanostructures 55. In an embodiment, the channel regions may be formed in the second semiconductor layers 54A-54C including the second semiconductor materials. The pattern of the masks 74 may be used to physically separate each of the dummy gates 72 from adjacent dummy gates 72. The dummy gates 72 may have a lengthwise direction substantially perpendicular to lengthwise directions of respective nanostructures 55.

Figure 7A:
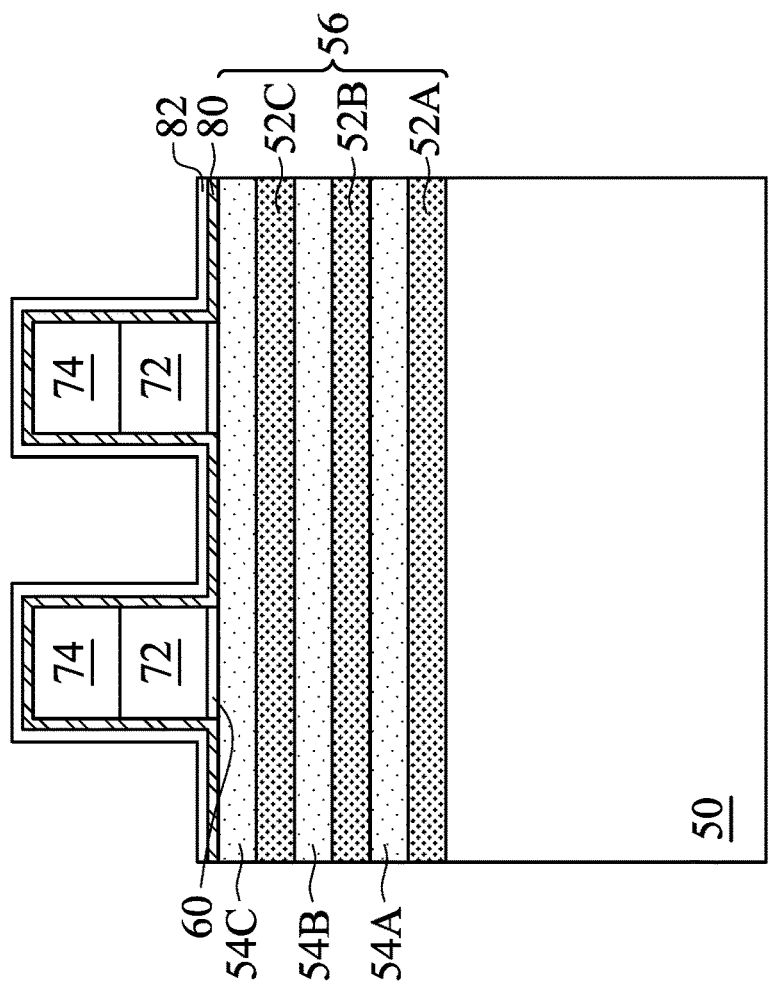
Figure 7B:
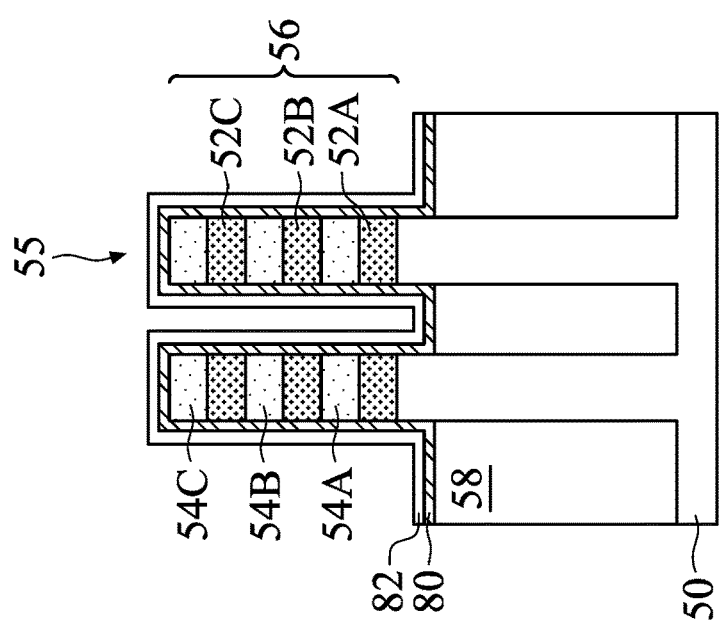

In FIGS. 7A and 7B, a first spacer layer 80 and a second spacer layer 82 are formed over the structures illustrated in FIGS. 6A and 6B. In FIGS. 7A and 7B, the first spacer layer 80 is formed on top surfaces of the STI regions 58, top surfaces and sidewalls of the nanostructures 55 and the masks 74, and sidewalls of the substrate 50, the dummy gates 72 and the dummy dielectric layers 60. The second spacer layer 82 is deposited over the first spacer layer 80. The first spacer layer 80 may be formed by thermal oxidation or deposited by CVD, ALD, or the like. The first spacer layer 80 may be formed of silicon oxide, silicon nitride, silicon oxynitride, or the like. The second spacer layer 82 may be deposited by CVD, ALD, or the like. The second spacer layer 82 may be formed of silicon oxide, silicon nitride, silicon oxynitride, or the like.

Figure 8A:
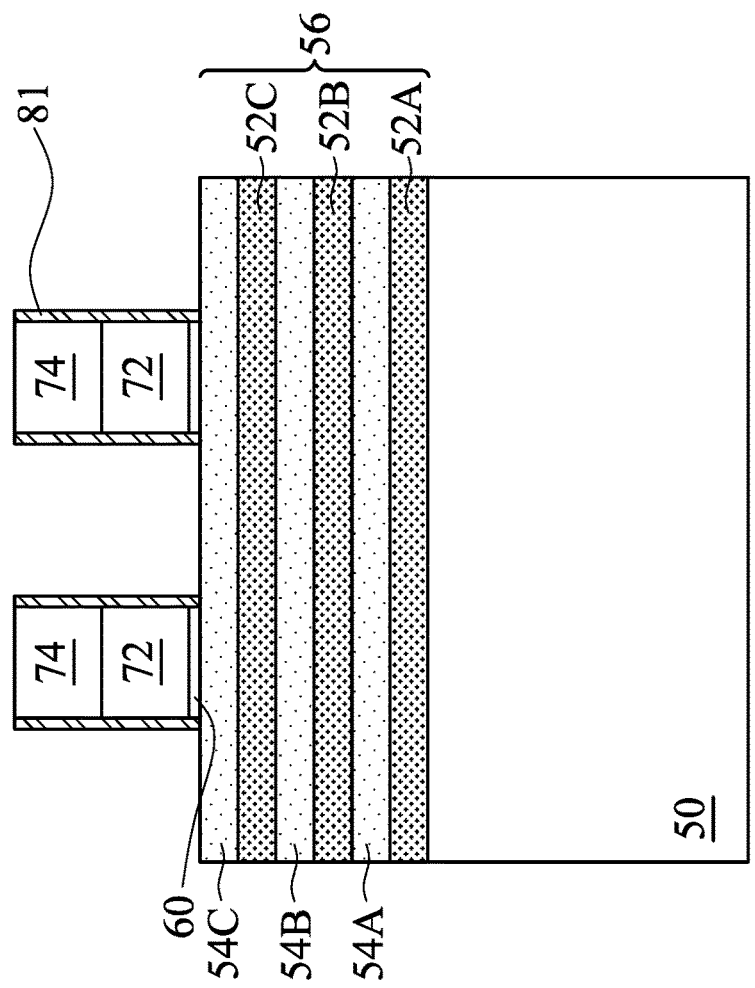
Figure 8B:
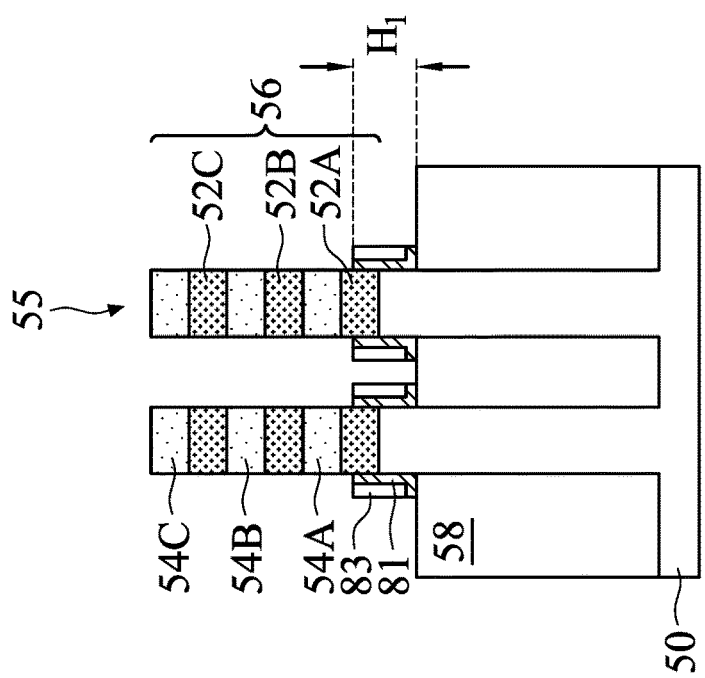

In FIGS. 8A and 8B, the first spacer layer 80 and the second spacer layer 82 are etched to form first spacers 81 and second spacers 83. The first spacer layer 80 and the second spacer layer 82 may be etched using a suitable etching process, such as an isotropic etching process (e.g., a wet etching process), an anisotropic etching process (e.g., a dry etching process), or the like. As illustrated in FIG. 8A, the first spacers 81 and the second spacers 83 are disposed on sidewalls of the nanostructures 55 and the substrate 50. As illustrated in FIG. 8B, the second spacer layer 82 may be removed from over the first spacer layer 80 adjacent the masks 74, the dummy gates 72, and the dummy dielectric layers 60 and the first spacers 81 are disposed on sidewalls of the masks 74, the dummy gates 72, and the dummy dielectric layers 60.

After the first spacers 81 and the second spacers 83 are formed, implants for lightly doped source/drain (LDD) regions (not separately illustrated) may be performed. In embodiments with different device types, similar to the implants discussed above in FIG. 4, a mask, such as a photoresist, may be formed over the region 50N, while exposing the region 50P, and appropriate type (e.g., p-type) impurities may be implanted into the exposed nanostructures 55 and the substrate 50 in the region 50P. The mask may then be removed. Subsequently, a mask, such as a photoresist, may be formed over the region 50P while exposing the region 50N, and appropriate type impurities (e.g., n-type) may be implanted into the exposed nanostructures 55 and the substrate 50 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $1 \times 10^{15}$ atoms/cm$^3$ to about $1 \times 10^{19}$ atoms/cm$^3$, such as about $5 \times 10^{18}$ atoms/cm$^3$. An anneal may be used to repair implant damage and to activate the implanted impurities.

It is noted that the above disclosure generally describes a process of forming spacers and LDD regions. Other processes and sequences may be used. For example, fewer or additional spacers may be utilized, different sequence of steps may be utilized (e.g., the first spacers 81 may be formed prior to forming the second spacers 83, additional spacers may be formed and removed, and/or the like. Furthermore, the n-type and p-type devices may be formed using a different structures and steps.

In FIGS. 9A and 9B, first recesses 86 are formed in the nanostructures 55 and the substrate 50. The first recesses 86 may extend through the first semiconductor layers 52A-52C and the second semiconductor layers 54A-54C, and into the substrate 50. As illustrated in FIG. 9A, top surfaces of the STI regions 58 may be level with a top surface of the substrate 50. In various embodiments, the first recesses may extend to a top surface of the substrate 50 without etching the substrate 50; the substrate 50 may be etched such that bottom surfaces of the first recesses 86 are disposed below the top surfaces of the STI regions 58; or the like. The first recesses 86 may be formed by etching the nanostructures 55 and the substrate 50 using anisotropic etching processes, such as RIE, NBE, or the like. The first spacers 81, the second spacers 83, and the masks 74 mask portions of the nanostructures 55 and the substrate 50 during the etching processes used to form the first recesses 86. A single etch process may be used to etch each layer of the multi-layer stack 56. In other embodiments, multiple etch processes may be used to etch the layers of the multi-layer stack 56. Timed etch processes may be used to stop the etching of the first recesses 86 after the first recesses 86 reach a desired depth.

Figure 10B:
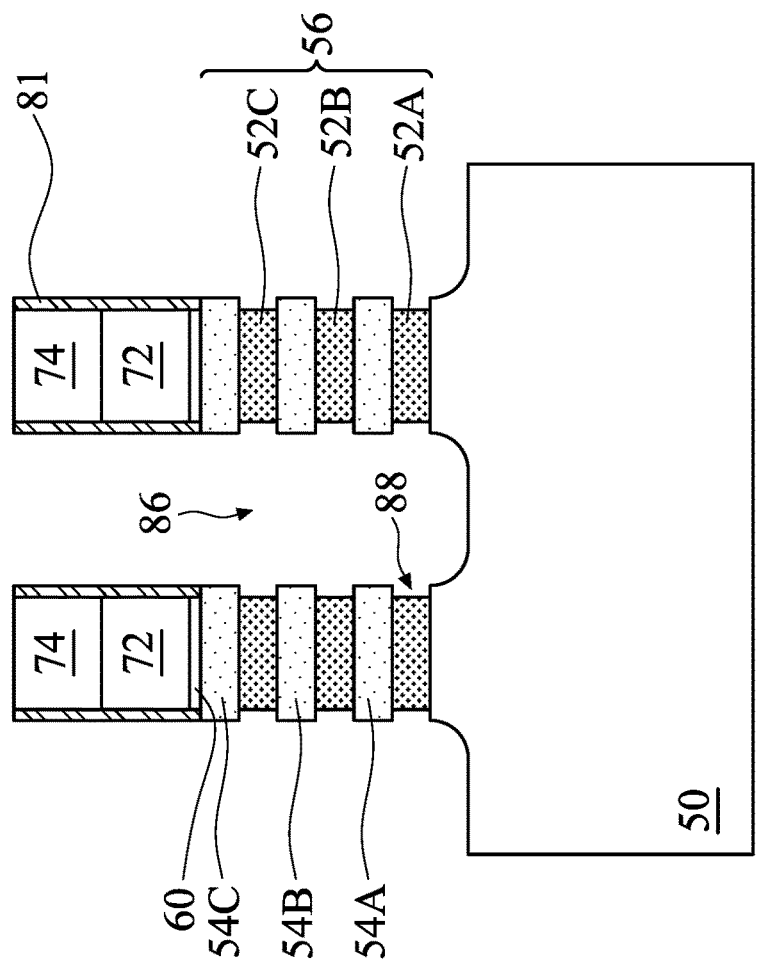
Figure 10A:
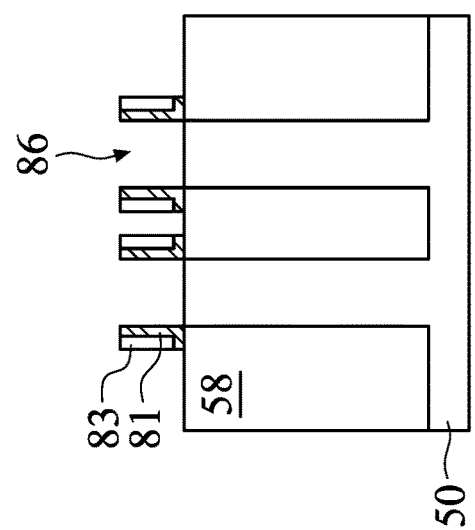

In FIGS. 10A and 10B, portions of sidewalls of the layers of the multi-layer stack 56 formed of the first semiconductor materials (e.g., the first semiconductor layers 52A-52C) exposed by the first recesses 86 are etched to form sidewall recesses 88. The sidewalls may be etched using isotropic etching processes, such as wet etching or the like. The etchants used to etch the first semiconductor layers 52A-52C may be selective to the first semiconductor materials such that the second semiconductor layers 54A-54C and the substrate 50 remain relatively unetched as compared to the first semiconductor layers 52A-52C. In an embodiment in which the first semiconductor layers 52A-52C include, e.g., SiGe, and the second semiconductor layers 54A-54C include, e.g., Si or SiC, tetramethylammonium hydroxide (TMAH), ammonium hydroxide ($NH_4OH$), or the like may be used to etch sidewalls of the multi-layer stack 56. In further embodiments, the layers of the multi-layer stack 56 may be etched using a dry etching process. Hydrogen fluoride, another fluorine-based gas, or the like may be used to etch sidewalls of the multi-layer stack 56.

Figure 11B:
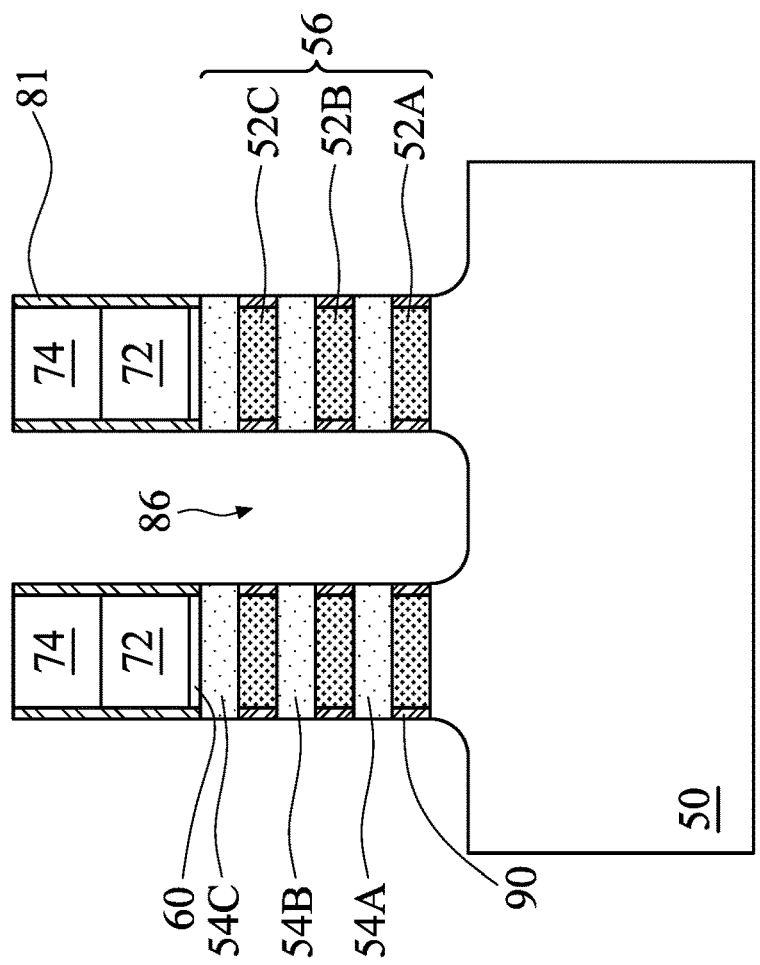
Figure 11A:
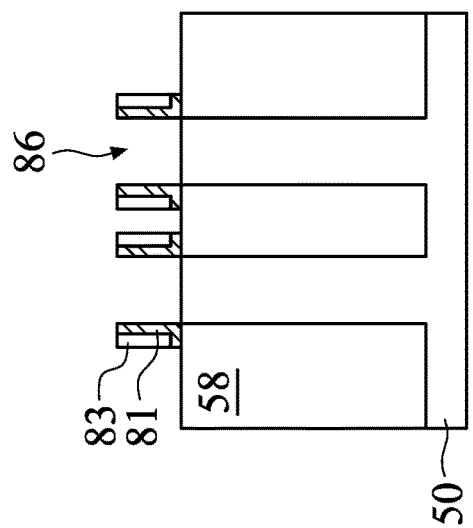

In FIGS. 11A and 11B, inner spacers 90 are formed in the sidewall recess 88. The inner spacers 90 may be formed by depositing an inner spacer layer (not separately illustrated) over the structures illustrated in FIGS. 10A and 10B. The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be etched to form the inner spacers 90. The inner spacer layer may be etched by an anisotropic etching process, such as RIE, NBE, or the like. The inner spacers 90 may be used to prevent damage to subsequently formed source/drain regions (such as the epitaxial source/drain regions 92, discussed below with respect to FIGS. 12A-12C) by subsequent etching processes.

Figure 12B:
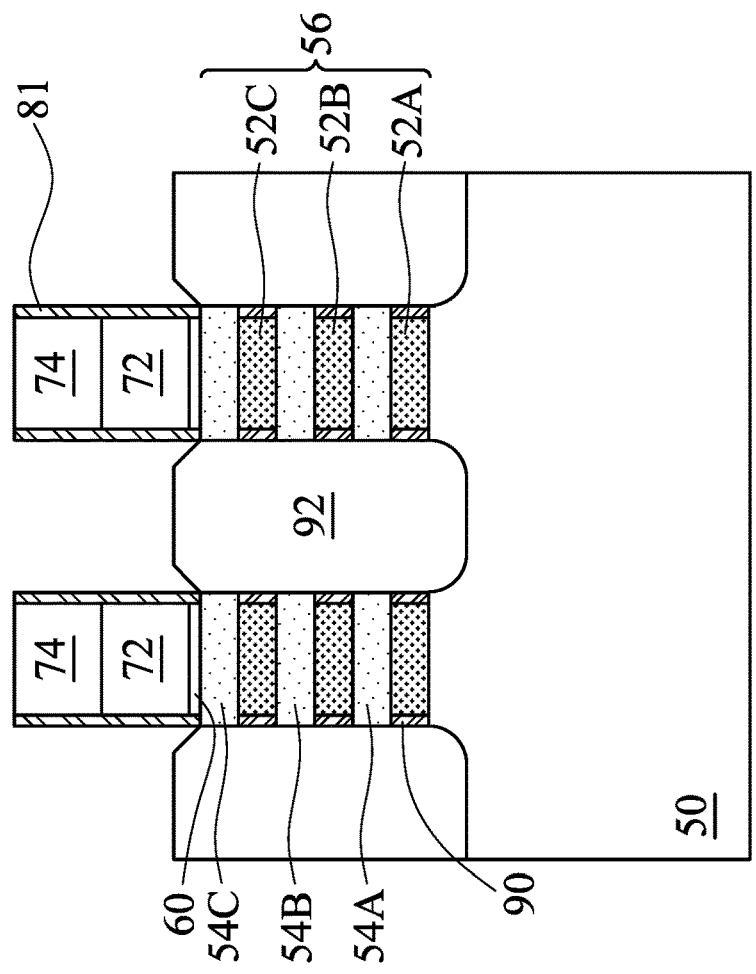
Figure 12A:
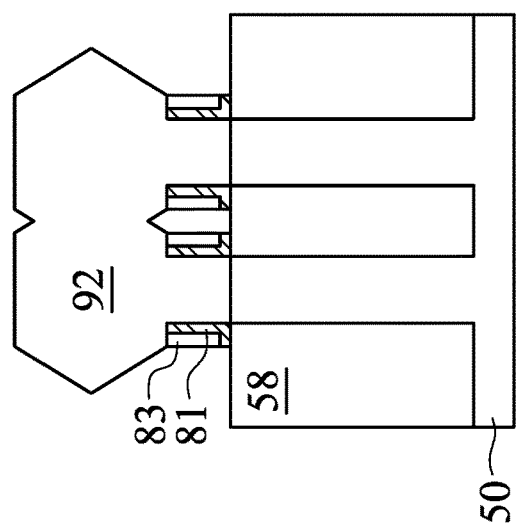

In FIGS. 12A-12C, epitaxial source/drain regions 92 are formed in the first recesses 86 to exert stress on the second semiconductor layers 54A-54C of the nanostructures 55, thereby improving performance. As illustrated in FIG. 12B, the epitaxial source/drain regions 92 are formed in the first recesses 86 such that each dummy gate 72 is disposed between respective neighboring pairs of the epitaxial source/drain regions 92. In some embodiments, the first spacers 81 are used to separate the epitaxial source/drain regions 92 from the dummy gates 72 by an appropriate lateral distance so that the epitaxial source/drain regions 92 do not short out subsequently formed gates of the resulting NSFETs. The inner spacers 90 may be used to separate the epitaxial source/drain regions 92 from the first semiconductor layers 52A-52C by appropriate lateral distances to prevent shorts between the epitaxial source/drain regions 92 and the subsequently formed gates of the resulting NSFETs.

The epitaxial source/drain regions 92 in the region 50N, e.g., the NMOS region, may be formed by masking the region 50P, e.g., the PMOS region. Then, the epitaxial source/drain regions 92 are epitaxially grown in the first recesses 86. The epitaxial source/drain regions 92 may include any acceptable material, such as appropriate for n-type NSFETs. For example, if the second semiconductor layers 54A-54C are silicon, the epitaxial source/drain regions 92 may include materials exerting a tensile strain on the second semiconductor layers 54A-54C, such as silicon, silicon carbide, phosphorous doped silicon carbide, silicon phosphide, or the like. The epitaxial source/drain regions 92 may have surfaces raised from respective surfaces of the multi-layer stack 56 and may have facets.

The epitaxial source/drain regions 92 in the region 50P, e.g., the PMOS region, may be formed by masking the region 50N, e.g., the NMOS region. Then, the epitaxial source/drain regions 92 are epitaxially grown in the first recesses 86. The epitaxial source/drain regions 92 may include any acceptable material, such as appropriate for p-type NSFETs. For example, if the second semiconductor layers 54A-54C are silicon, the epitaxial source/drain regions 92 may comprise materials exerting a compressive strain on the second semiconductor layers 54A-54C, such as silicon-germanium, boron doped silicon-germanium, germanium, germanium tin, or the like. The epitaxial source/drain regions 92 may also have surfaces raised from respective surfaces of the multi-layer stack 56 and may have facets.

The epitaxial source/drain regions 92, the second semiconductor layers 54A-54C, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/$cm^3$ and about $1\times10^{21}$ atoms/$cm^3$, such as about $5.05\times10^{20}$ atoms/$cm^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the region 50N and the region 50P, upper surfaces of the epitaxial source/drain regions have facets which expand laterally outward beyond sidewalls of the nanostructures 55. In some embodiments, these facets cause adjacent epitaxial source/drain regions 92 of a same NSFET to merge as illustrated by FIG. 12A. In other embodiments, adjacent epitaxial source/drain regions 92 remain separated after the epitaxy process is completed as illustrated by FIG. 12C. In the embodiments illustrated in FIGS. 12A and 12C, the first spacers 81 may be formed covering portions of the sidewalls of the nanostructures 55 and the substrate 50 that extend above the STI regions 58 thereby blocking the epitaxial growth. In some other embodiments, the spacer etch used to form the first spacers 81 may be adjusted to remove the spacer material to allow the epitaxially grown region to extend to the surface of the STI region 58.

Figure 13B:
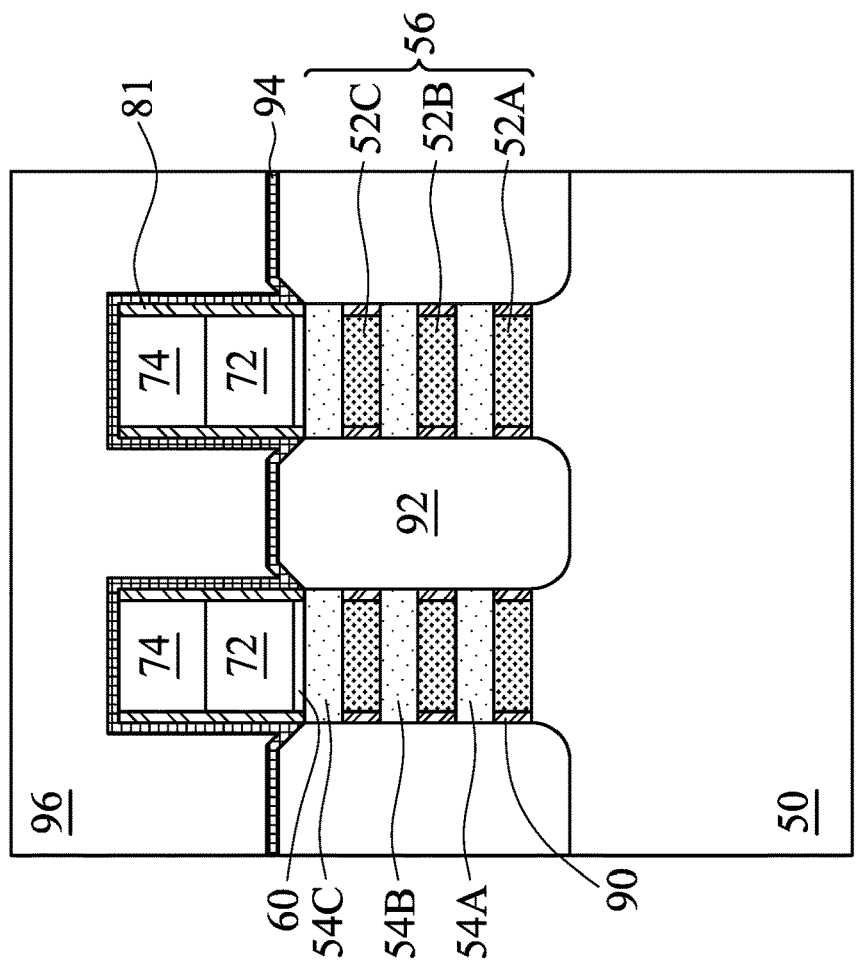
Figure 13A:
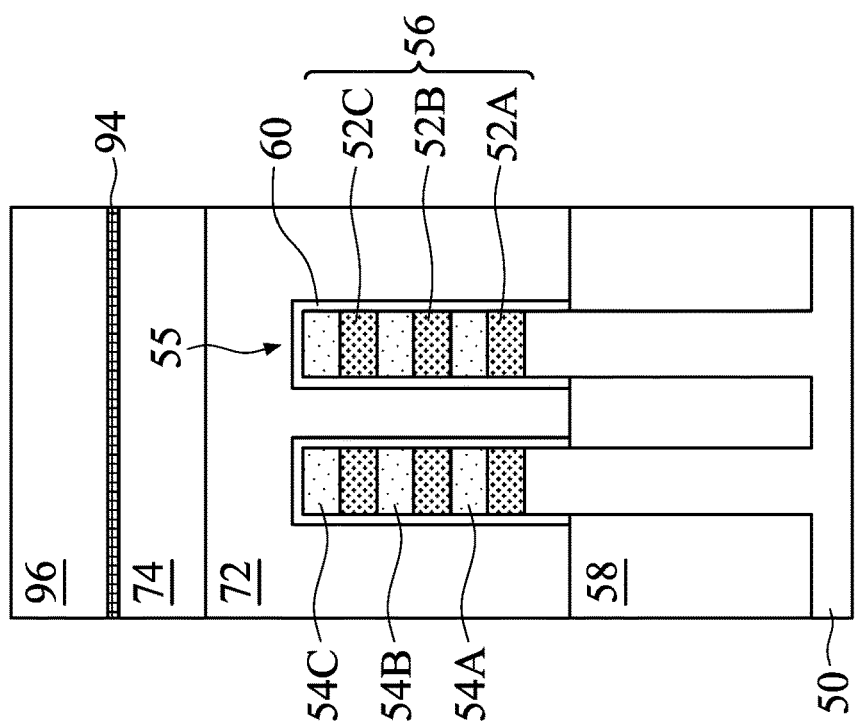

In FIGS. 13A and 13B, a first interlayer dielectric (ILD) 96 is deposited over the structure illustrated in FIGS. 6A and 12B (the processes of FIGS. 7A-12B do not alter the cross-section illustrated in FIG. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 74, and the first spacers 81. The CESL 94 may comprise a dielectric material, such as, silicon nitride, silicon oxide, silicon oxynitride, or the like, having a different etch rate than the material of the overlying first ILD 96.

Figure 14B:
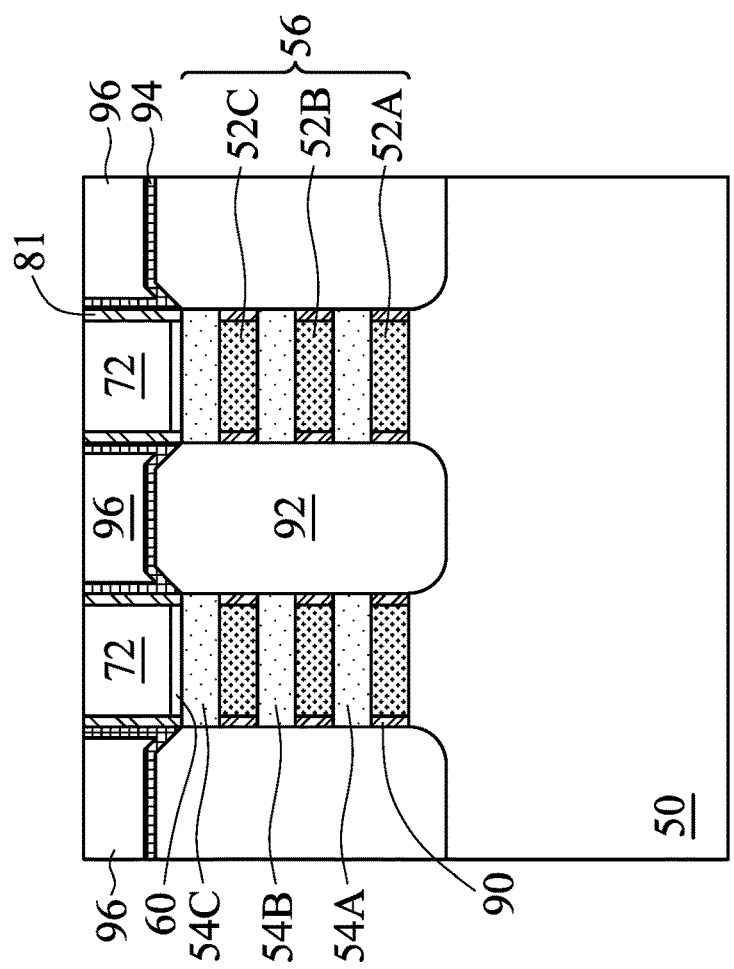
Figure 14A:
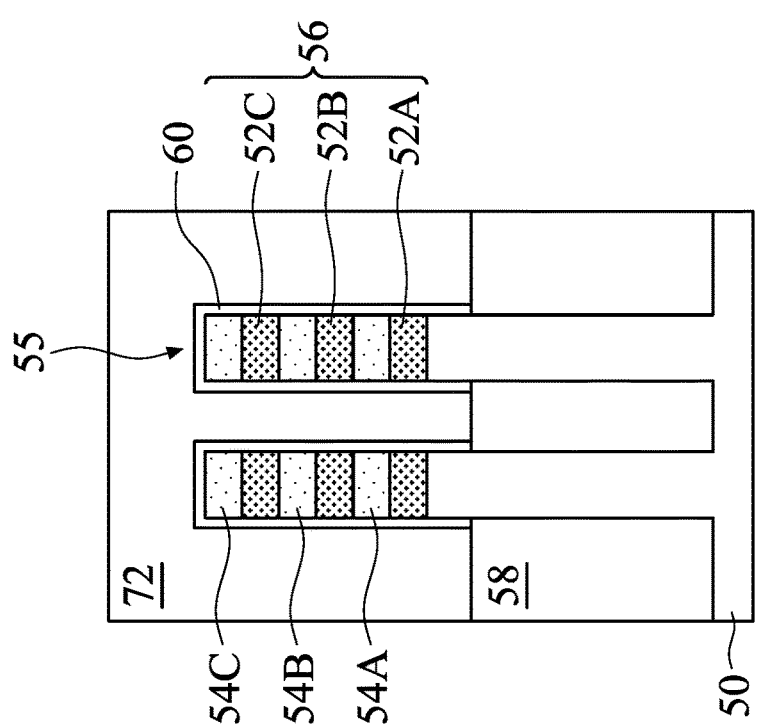

In FIGS. 14A and 14B, a planarization process, such as a CMP, may be performed to level the top surface of the first ILD 96 with the top surfaces of the dummy gates 72 or the masks 74. The planarization process may also remove the masks 74 on the dummy gates 72, and portions of the first spacers 81 along sidewalls of the masks 74. After the planarization process, top surfaces of the dummy gates 72, the first spacers 81, and the first ILD 96 are level. Accordingly, the top surfaces of the dummy gates 72 are exposed through the first ILD 96. In some embodiments, the masks 74 may remain, in which case the planarization process levels the top surface of the first ILD 96 with top surface of the masks 74 and the first spacers 81.

Figure 15B:
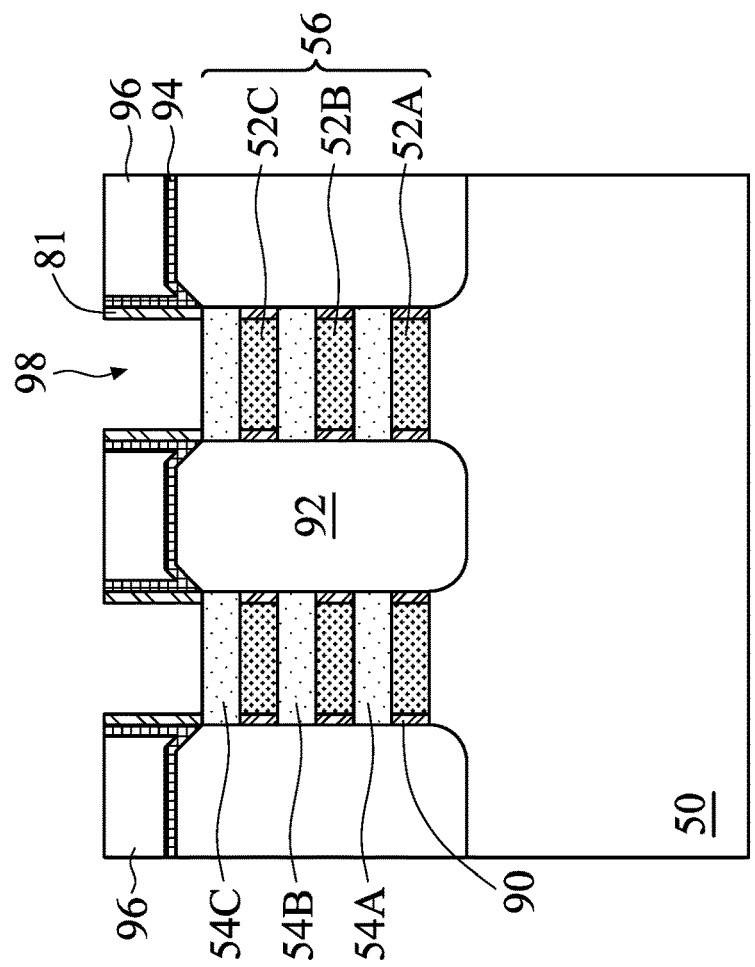
Figure 15A:
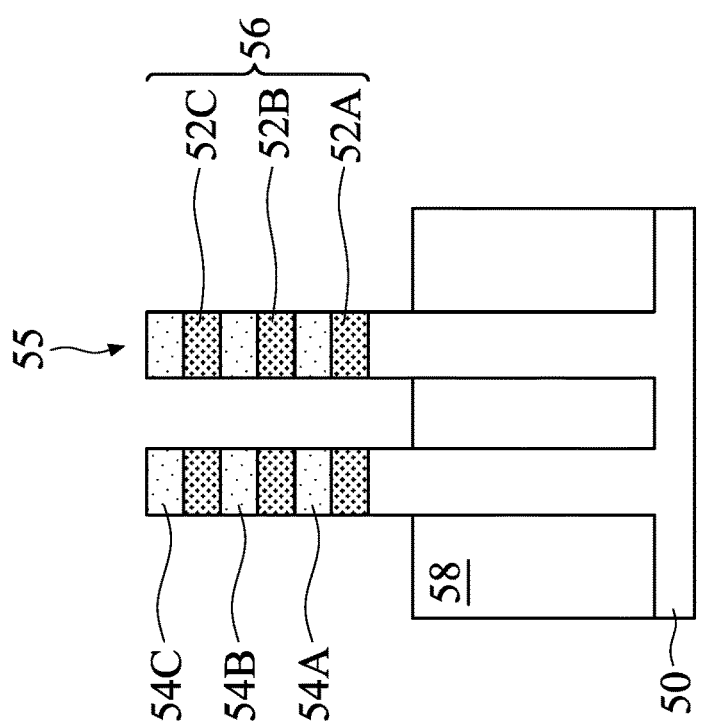

In FIGS. 15A and 15B, the dummy gates 72, and the masks 74 if present, are removed in an etching step(s), so that second recesses 98 are formed. Portions of the dummy dielectric layers 60 in the second recesses 98 may also be removed. In some embodiments, only the dummy gates 72 are removed and the dummy dielectric layers 60 remain and are exposed by the second recesses 98. In some embodiments, the dummy dielectric layers 60 are removed from second recesses 98 in a first region of a die (e.g., a core logic region) and remain in second recesses 98 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 at a faster rate than the first ILD 96 or the first spacers 81. Each second recess 98 exposes and/or overlies portions of the multi-layer stack 56, which act as channel regions in subsequently completed NSFETs. Portions of the multi-layer stack 56 which act as the channel regions are disposed between neighboring pairs of the epitaxial source/drain regions 92. During the removal, the dummy dielectric layers 60 may be used as etch stop layers when the dummy gates 72 are etched. The dummy dielectric layers 60 may then be optionally removed after the removal of the dummy gates 72.

Figure 16B:
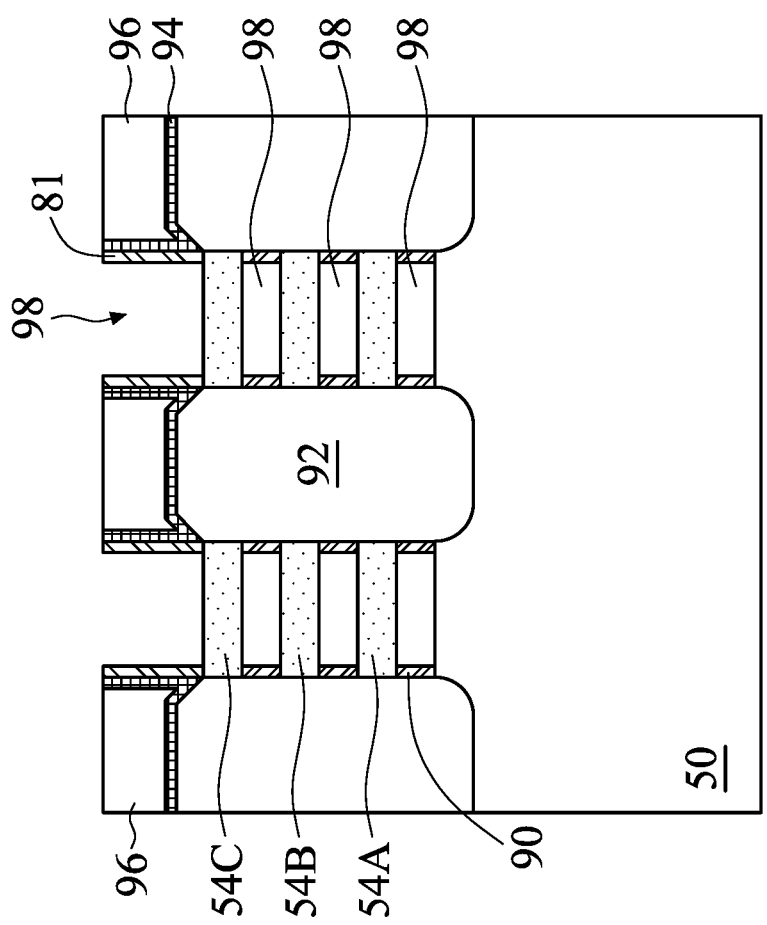
Figure 16A:
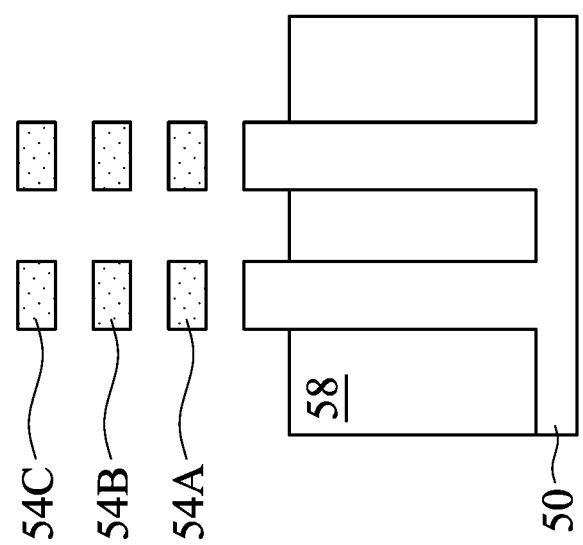

In FIGS. 16A and 16B, the first semiconductor layers 52A-52C are removed extending the second recesses 98. The first semiconductor layers 52A-52C may be removed by an isotropic etching process such as wet etching or the like. The first semiconductor layers 52A-52C may be removed using etchants which are selective to the materials of the first semiconductor layers 52A-52C, while the second semiconductor layers 54A-54C, the substrate 50, the STI regions 58 remain relatively unetched as compared to the first semiconductor layers 52A-52C. In an embodiment in which the first semiconductor layers 52A-52C include, e.g., SiGe, and the second semiconductor layers 54A-54C include, e.g., Si or SiC, tetramethylammonium hydroxide (TMAH), ammonium hydroxide (NH$_4$OH), or the like may be used to remove the first semiconductor layers 52A-52C. In some embodiments, a ratio of a thickness of the second semiconductor layers 54A-54C to a distance between adjacent ones of the second semiconductor layers 54A-54C or a distance between the second semiconductor layer 54A and the substrate 50 may be from about 0.5 to about 0.9, such as about 0.7 in the region 50N and in the region 50P.

Figures 17A, 17B:
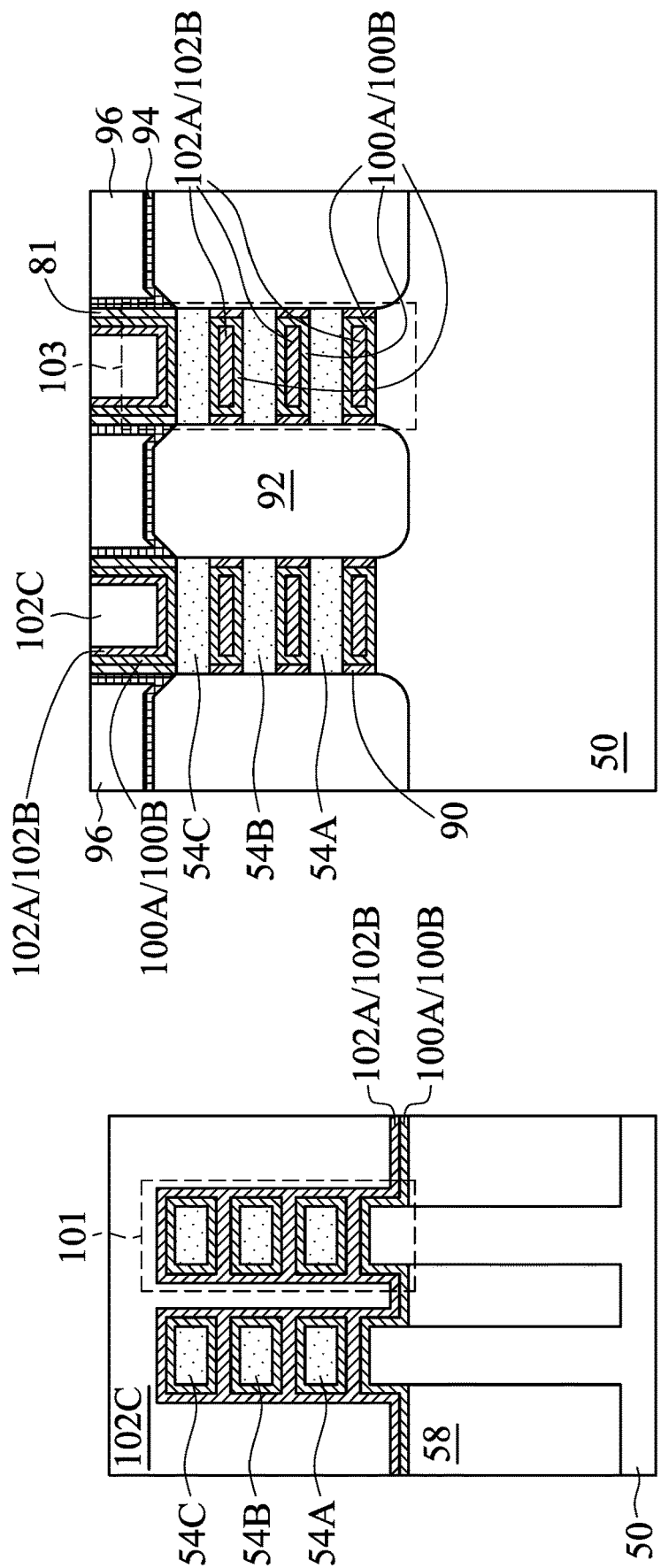
Figures 17C, 17D:
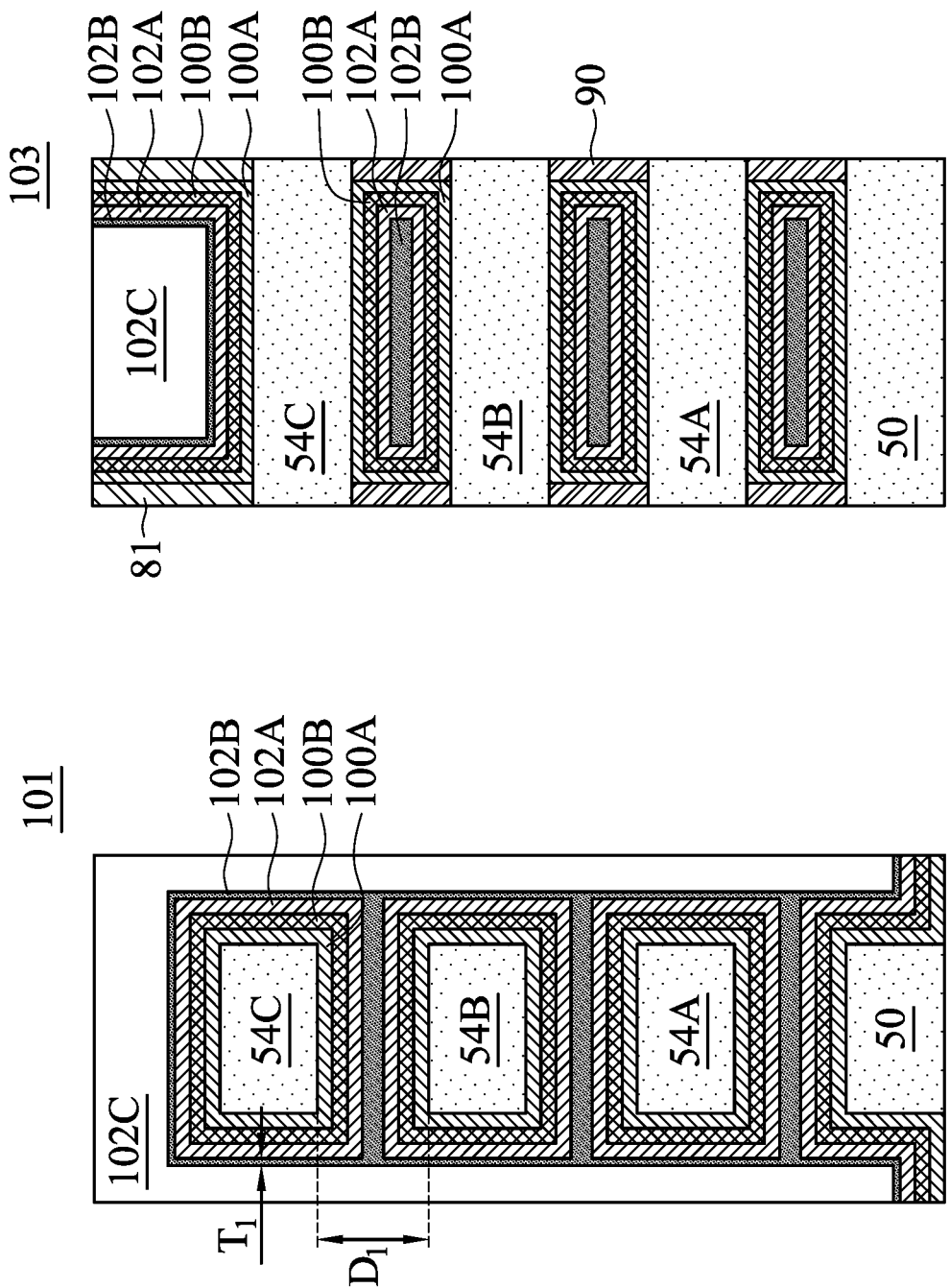

In FIGS. 17A and 17B, gate dielectric layers 100 and gate electrodes 102 are formed for replacement gates. FIG. 17C illustrates a detailed view of region 101 of FIG. 17A and FIG. 17D illustrates a detailed view of region 103 of FIG. 17B. The gate dielectric layers 100 are deposited conformally in the second recesses 98, such as on top surfaces and sidewalls of the substrate 50, and on top surfaces, sidewalls and bottom surfaces of the second semiconductor layers 54A-54C. The gate dielectric layers 100 may also be deposited on top surfaces of the first ILD 96, the CESL 94, and the STI regions 58 and on top surfaces and sidewalls of the first spacers 81.

The gate electrodes 102 are deposited over the gate dielectric layers 100, respectively, and fill the remaining portions of the second recesses 98. After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gates of the resulting NSFETs. The gate electrodes 102 and the gate dielectric layers 100 may be collectively referred to as "gate stacks."

As illustrated in FIGS. 17C and 17D, the gate dielectric layers 100 may include interfacial layers 100A and first dielectric layers 100B and the gate electrodes 102 may include work function metal layers 102A, barrier layers 102B, and a fill material 102C. The interfacial layers 100A may include dielectric materials such as silicon oxide (SiO$_2$), silicon oxynitride (SiON), or the like. The interfacial layers 100A may be formed by chemical oxidation, thermal oxidation, atomic layer deposition (ALD), CVD, or the like. The interfacial layers 100A may have thicknesses from about 10 Å to about 15 Å, such as about 12.5 Å.

The first dielectric layers 100B may be deposited over the interfacial layer 100A using conformal processes. The first dielectric layers 100B may be high-dielectric constant (high-k) materials such as hafnium oxide (HfO$_2$), aluminum oxide (Al$_2$O$_3$), lanthanide oxide (LaO$_2$), titanium oxide (TiO$_2$), hafnium zirconium oxide (HfZrO$_2$), tantalum oxide (Ta$_2$O$_3$), hafnium silicon oxide (HfSiO$_4$), zirconium oxide (ZrO$_2$), zirconium silicon oxide (ZrSiO$_2$), combinations thereof or multiple layers thereof, or the like. The first dielectric layers 100B may be formed by ALD, CVD, or the like. In some embodiments, the interfacial layers 100A may be omitted and the first dielectric layers 100B may be deposited directly on the substrate 50 and the second semiconductor layers 54A-54C. The first dielectric layers 100B may have thicknesses from about 10 Å to about 20 Å, such as about 15 Å.

The formation of the interfacial layers 100A and the first dielectric layers 100B in the region 50N and the region 50P may occur simultaneously such that the gate dielectric layers 100 in each region are formed from the same materials. In some embodiments, the gate dielectric layers 100 in each region may be formed by distinct processes, such that the gate dielectric layers 100 may be different materials. Various masking steps may be used to mask and expose appropriate regions when using distinct processes.

After the first dielectric layers 100B are formed, the work function metal layers 102A are formed on the first dielectric layers 100B. The work function metal layers 102A are formed for tuning the work function of the device. The work function metal layers 102A may be n-type work function materials for n-type NSFET devices in the region 50N, or p-type work function materials for p-type NSFET devices in the region 50P. Suitable examples of the n-type work function materials include Ti, Ag, TaAl, TaAlC, HfAl, TiAl, TiAlN, TiAlC, TaC, TaCN, TaSiN, Mn, Zr, other suitable n-type work function metal materials, or combinations thereof. Suitable examples of the p-type work function materials include TiN, TaN, Ru, Mo, Al, WN, ZrSi$_2$, MoSi$_2$, TaSi$_2$, NiSi$_2$, WN, other suitable p-type work function metal materials, or combinations thereof. The work function metal layers 102A may be formed by ALD, CVD, or the like. The work function metal layers 102A may have thicknesses from about 10 Å to about 40 Å, such as about 25 Å. The work function metal layers 102A may be formed such that a space remains between work function metal layers 102A deposited on adjacent ones of the substrate 50 and the second semiconductor layers 54A-54C.

After the work function metal layers 102A are formed, the barrier layers 102B are formed on the work function metal layers 102A. The barrier layers 102B are formed to prevent metals from the work function metal layers 102A deposited on any of the substrate 50 or the second semiconductor layers 54A-54C from diffusing into the gate dielectric layers 100 of an adjacent substrate 50 or second semiconductor layer 54A-54C. The barrier layers 102B may further prevent the work function metal layers 102A deposited on adjacent ones of the substrate 50 and the second semiconductor layers 54A-54C from merging and may be used to ensure the work function metal layers 102A have the same thickness around perimeters of the second semiconductor layers 54A-54C. As illustrated in FIG. 17C, the barrier layers 102B formed on adjacent ones of the substrate 50 and the second semiconductor layers 54A-54C may merge with one another. The barrier layers 102B may fill spaces left between the work function metal layers 102A deposited on adjacent ones of the substrate 50 and the second semiconductor layers 54A-54C.

Materials for the barrier layers 102B in the region 50N may include semiconductive materials, non-conductive materials, or conductive materials. For example, suitable materials for the barrier layers 102B in the region 50N include silicon, silicon oxide, tantalum nitride, and the like. The barrier layers 102B in the region 50N may have thicknesses from about 10 Å to about 30 Å, such as about 20 Å. A ratio of thicknesses $T_1$ of the barrier layers 102B in the region 50N to distances $D_1$ between adjacent ones of the second semiconductor layers 54A-54C or between the second semiconductor layer 54A and the substrate 50 may be from about 0.1 to about 0.5, such as about 0.3. The thicknesses $T_1$ of the barrier layers 102B may be measured at points level with middles of the second semiconductor layers 54A-54C and in directions parallel to a major surface of the substrate 50. The distances $D_1$ may be measured between centers of the second semiconductor layers 54A-54C and the substrate 50 in directions perpendicular to the major surface of the substrate 50. Distances between the barrier layers 102B and the second semiconductor layers 54A-54C are greater than distances between the work function metal layers 102A and the second semiconductor layers 54A-54C, thus the barrier layers 102B may have reduced impacts on the work function of devices as compared to the work function metal layers 102A.

Materials for the barrier layers 102B in the region 50P may include semiconductive materials or conductive materials. For example, suitable materials for the barrier layers 102B in the region 50P include silicon, tantalum nitride, tungsten nitride, tungsten carbonitride, and the like. The barrier layers 102B in the region 50P may have thicknesses from about 10 Å to about 30 Å, such as about 20 Å. A ratio of thicknesses $T_1$ of the barrier layers 102B in the region 50P to distances $D_1$ between adjacent ones of the second semiconductor layers 54A-54C or between the semiconductor layer 54A and the substrate 50 may be from about 0.1 to about 0.5, such as about 0.3. The thicknesses $T_1$ of the barrier layers 102B may be measured at points level with middles of the second semiconductor layers 54A-54C and in directions parallel to a major surface of the substrate 50. The distances $D_1$ may be measured between centers of the second semiconductor layers 54A-54C and the substrate 50 in directions perpendicular to the major surface of the substrate 50. Distances between the barrier layers 102B and the second semiconductor layers 54A-54C are greater than distances between the work function metal layers 102A and the second semiconductor layers 54A-54C, thus the barrier layers 102B may have reduced impacts on the work function of devices as compared to the work function metal layers 102A.

The fill material 102C is then deposited over the barrier layers 102B. The fill material 102C may be a material such as tungsten (W), aluminum (Al), copper (Cu), titanium (Ti), manganese (Mn), zirconium (Zr), cobalt (Co), nickel (Ni), tantalum (Ta), AlCu, TiAlN, TaC, TaCN, TaSiN, TiN, TaN, alloys or combinations thereof, or the like. The fill material 102C may be deposited by ALD, CVD, or the like. Additionally, the fill material 102C may be deposited to a thickness of between about 1000 Å and about 2000 Å, such as about 1500 Å. However, any suitable material may be utilized. In some embodiments, the barrier layers 102B may not completely fill spaces between adjacent ones of the substrate and the second semiconductor layers 54A-54C. In such embodiments, the fill material 102C may fill any spaces left between the barrier layers 102B deposited on adjacent ones of the substrate 50 and the second semiconductor layers 54A-54C.

The work function metal layers 102A, the barrier layers 102B, and the fill materials 102C in the region 50N and the region 50P may be formed by distinct processes, such that the gate electrodes in each region may be formed of different materials. Various masking steps may be used to mask and expose appropriate regions when using distinct processes. In further embodiments, the formation of each of the work function metal layers 102A, the barrier layers 102B, and the fill materials 102C in the region 50N and the region 50P may occur simultaneously such that the gate electrodes 102 in each region are formed from the same materials. In an embodiment, the work function metal layers 102A in the region 50N and the region 50P may be formed using distinct processes and the barrier layers 102B and the fill materials 102C in the region 50N and the region 50P may be formed at the same time using the same processes. In another embodiment, the work function metal layers 102A and the barrier layers 102B in the region 50N and the region 50P may be formed using distinct processes and the fill materials 102C in the region 50N and the region 50P may be formed at the same time using the same processes.

Figures 18A, 18B:
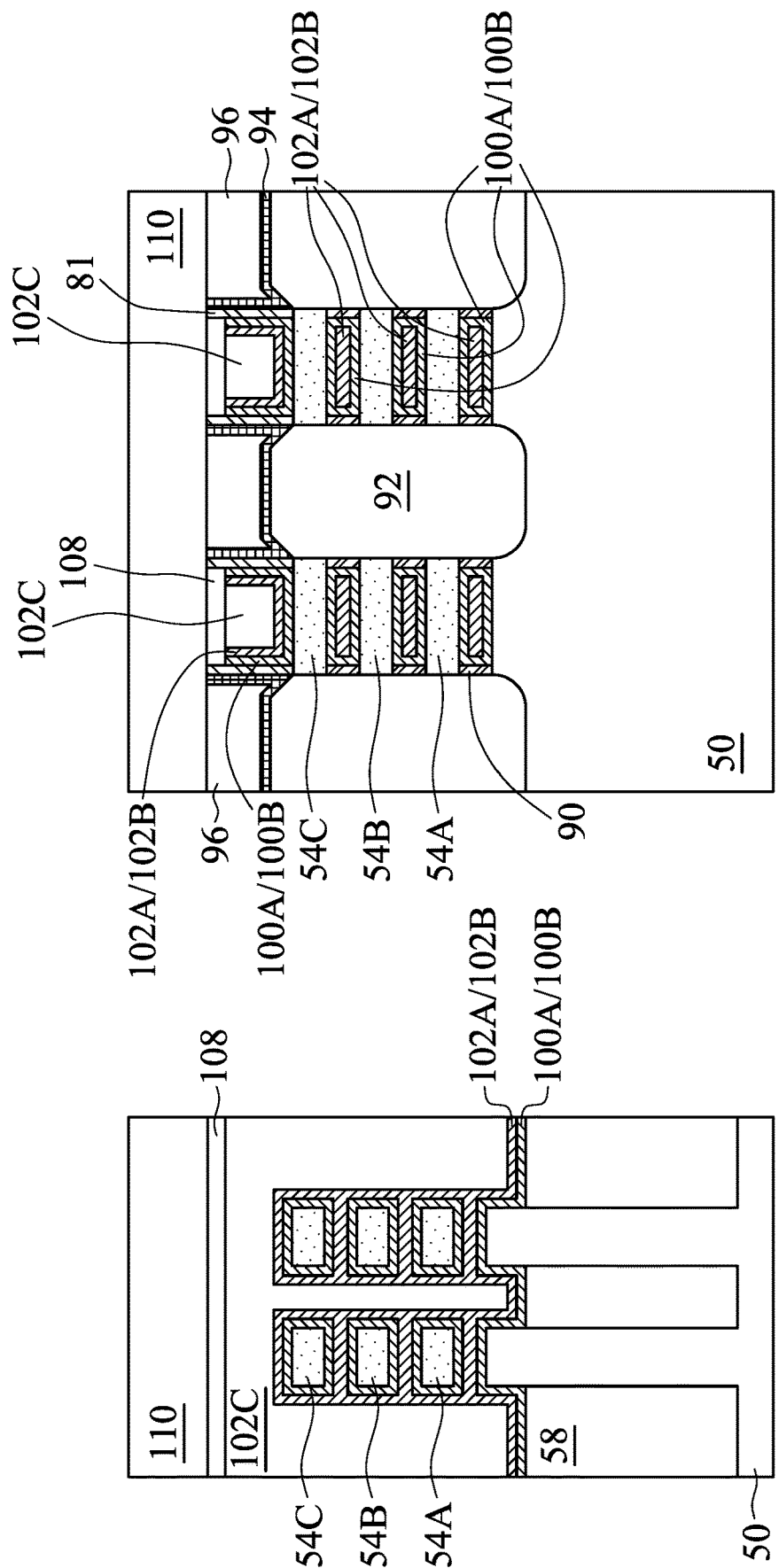

In FIGS. 18A and 18B, a second ILD 110 is deposited over the first ILD 96. In some embodiments, the second ILD 110 is a flowable film formed by FCVD. In some embodiments, the second ILD 110 is formed of a dielectric material such as PSG, BSG, BPSG, USG, or the like, and may be deposited by any suitable method, such as CVD, PECVD, or the like. In accordance with some embodiments, before the formation of the second ILD 110, the gate stack (including the gate dielectric layers 100 and the corresponding overlying gate electrodes 102) is recessed, so that a recess is formed directly over the gate stack and between opposing portions of first spacers 81. A gate mask 108 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 19A and 19B) penetrate through the gate mask 108 to contact the top surface of the recessed gate electrodes 102.

Figures 19A, 19B:
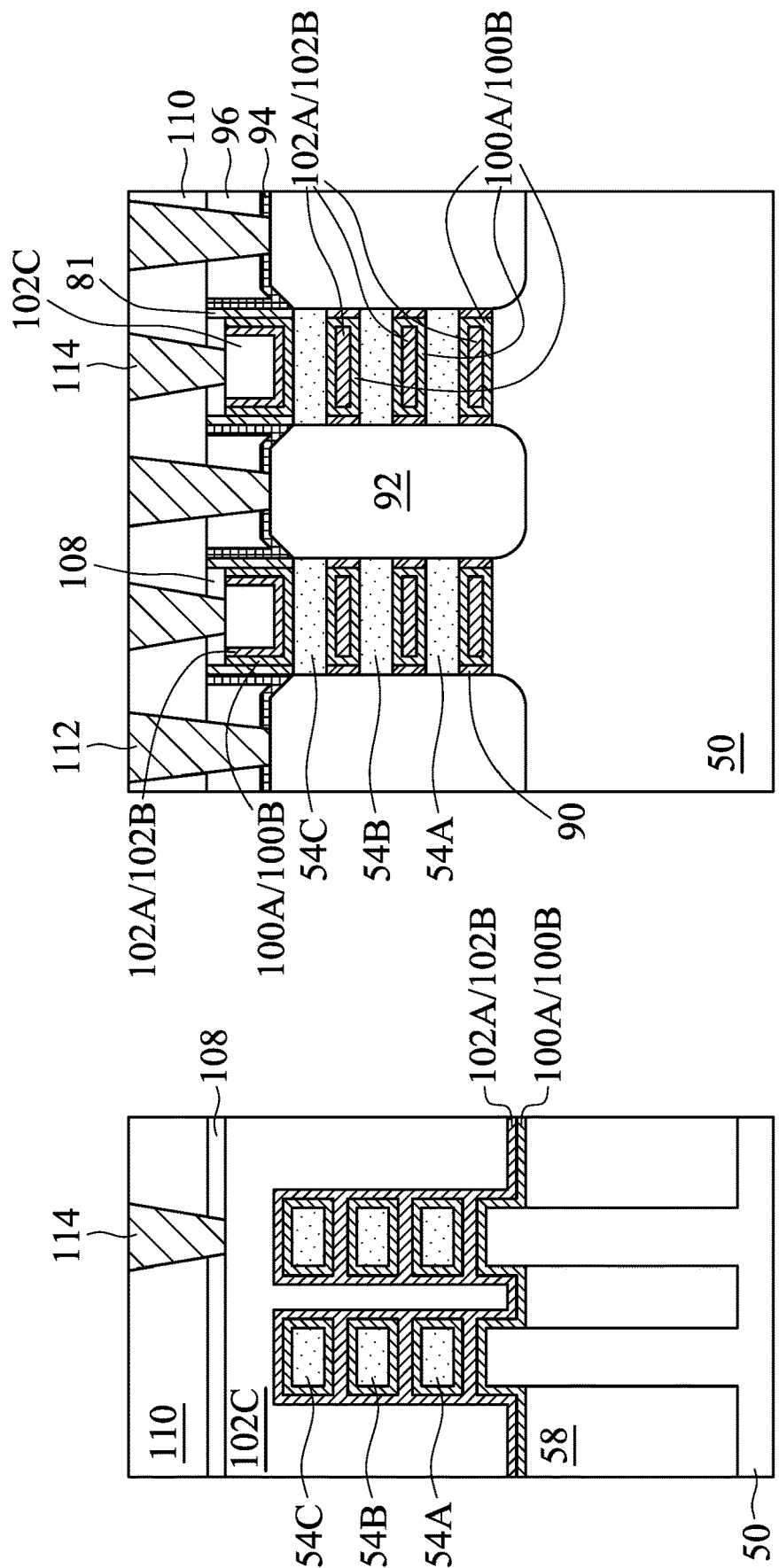

In FIGS. 19A and 19B, source/drain contacts 112 and gate contacts 114 are formed through the second ILD 110 and the first ILD 96. Openings for the source/drain contacts 112 are formed through the first ILD 96 and the second ILD 110, and openings for the gate contacts 114 are formed through the second ILD 110 and the gate mask 108. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 110. The remaining liner and conductive material form the source/drain contacts 112 and the gate contacts 114 in the openings. An anneal process may be performed to form a silicide at the interface between the epitaxial source/drain regions 92 and the source/drain contacts 112. The source/drain contacts 112 are physically and electrically coupled to the epitaxial source/drain regions 92, and the gate contacts 114 are physically and electrically coupled to the gate electrodes 102. The source/drain contacts 112 and the gate contacts 114 may be formed in different processes, or may be formed in the same process. Although shown as being formed in the same cross-sections, it should be appreciated that each of the source/drain contacts 112 and the gate contacts 114 may be formed in different cross-sections, which may avoid shorting of the contacts.

As discussed above, the gate electrodes 102 include the barrier layers 102B, which prevent metal from migrating from the work function metal layers 102A to the first dielectric layers 100B. This reduces device defects and improves device performance. The barrier layers 102B further prevent work function metal layers 102A deposited on adjacent second semiconductor layers 54A-54C from merging, which ensures that the work function metal layers 102A have even thicknesses around the perimeters of the second semiconductor layers 54A-54C. This improves device electrical performance and reduces device defects.

FIGS. 20A and 20B illustrate a detailed view of the region 101 of FIG. 17A and a detailed view of the region 103 of FIG. 17B, respectively, in accordance with some embodiments in which the barrier layers 102B formed on adjacent ones of the substrate 50 and the second semiconductor layers 54A-54C do not merge with one another. As illustrated in FIGS. 20A and 20B, the barrier layers 102B formed on adjacent ones of the substrate 50 and the second semiconductor layers 54A-54C are separated from one another by a distance. The fill material 102C may extend between the barrier layers 102B and fill gaps between the barrier layers 102B.

Figures 21A, 21B:
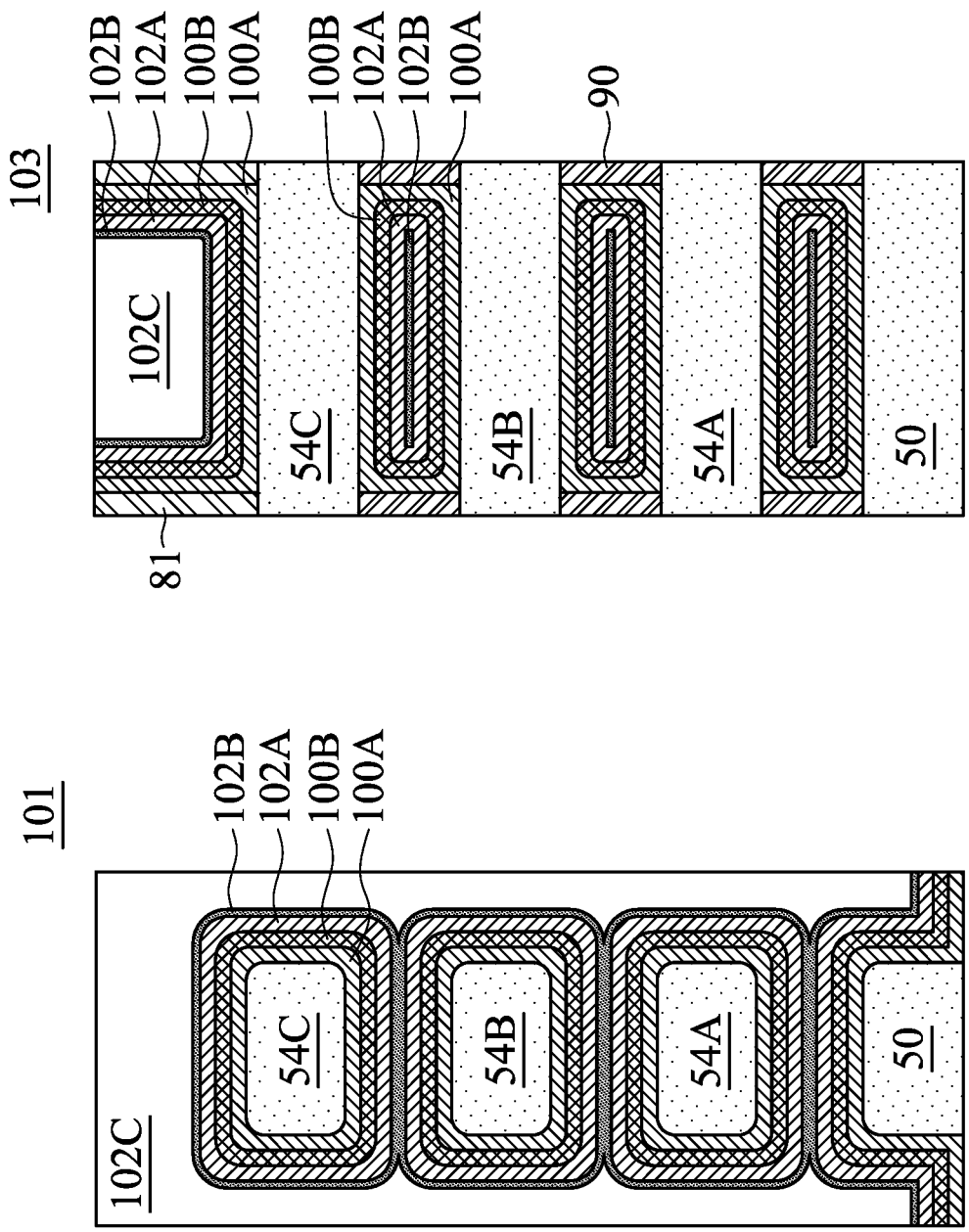

FIGS. 21A and 21B illustrate a detailed view of the region 101 of FIG. 17A and a detailed view of the region 103 of FIG. 17B, respectively, in accordance with some embodiments in which the second semiconductor layers 54A-54C and the substrate 50 have rounded corners. As illustrated in FIGS. 21A and 21B, the interfacial layers 100A, the first dielectric layers 100B, the work function metal layers 102A, and the barrier layers 102B may be deposited conformally such that a surface profile of each layer follows a surface profile of the underlying layer. As further illustrated in FIGS. 21A and 21B, some portions of the fill material 102C may extend between the barrier layers 102B formed on adjacent ones of the substrate 50 and the second semiconductor layers 54A-54C.

In accordance with an embodiment, a semiconductor device includes a semiconductor substrate; a first channel region over the semiconductor substrate; a second channel region over the first channel region; gate dielectric layers surrounding the first channel region and the second channel region; work function metal layers surrounding the gate dielectric layers; and barrier layers surrounding the work function metal layers, a first barrier layer surrounding the first channel region being merged with a second barrier layer surrounding the second channel region. In an embodiment, the work function metal layers include n-type work function metal layers. In an embodiment, the work function metal layers include p-type work function metal layers. In an embodiment, the barrier layers include silicon. In an embodiment, the work function metal layers include titanium nitride. In an embodiment, the barrier layers include tantalum nitride. In an embodiment, the barrier layers include silicon. In an embodiment, the work function metal layers include titanium aluminum carbide.

In accordance with another embodiment, a method includes forming a channel region over a semiconductor substrate; forming a gate dielectric layer surrounding the channel region; depositing a work function metal layer over the gate dielectric layer; depositing a barrier layer over the work function metal layer, the barrier layer, the work function metal layer, and the gate dielectric layer filling an opening between the semiconductor substrate and the channel region; and depositing a fill material over the barrier layer. In an embodiment, the barrier layer is deposited by atomic layer deposition (ALD). In an embodiment, the channel region is formed over a first region of the semiconductor substrate, the method further including forming a second channel region over a second region of the semiconductor substrate; forming the gate dielectric layer surrounding the second channel region; and depositing a second work function metal layer over the gate dielectric layer in the second region, the second work function metal layer including a material different from the work function metal layer. In an embodiment, the method further includes depositing a second barrier layer over the second work function metal layer, the second barrier layer including a material different from the barrier layer. In an embodiment, the method further includes depositing the fill material over the second barrier layer, the fill material being simultaneously deposited over the barrier layer and the second barrier layer. In an embodiment, the method further includes depositing a second barrier layer over the second work function metal layer, the second barrier layer being deposited simultaneously with the barrier layer and including the same material as the barrier layer.

In accordance with yet another embodiment, a semiconductor device includes a semiconductor substrate; a first channel region over and separated from the semiconductor substrate; a gate dielectric layer surrounding the first channel region; a work function metal layer surrounding the gate dielectric layer, a thickness of the work function metal layer in a direction perpendicular to a major surface of the semiconductor substrate being equal to a thickness of the work function metal layer in a direction parallel to the major surface of the semiconductor substrate; and a barrier layer surrounding the work function metal layer. In an embodiment, the semiconductor device further includes a second gate dielectric layer on the semiconductor substrate; a second work function metal layer on the second gate dielectric layer; and a second barrier layer on the second work function metal layer, the second barrier layer being merged with the barrier layer between the first channel region and the semiconductor substrate. In an embodiment, the semiconductor device further includes a second gate dielectric layer on the semiconductor substrate; a second work function metal layer on the second gate dielectric layer; a second barrier layer on the second work function metal layer; and a fill material surrounding the barrier layer and on the second barrier layer, the fill material extending from the barrier layer and the second barrier layer between the first channel region and the semiconductor substrate. In an embodiment, the work function metal layer has a thickness from 10 Å to 40 Å. In an embodiment, the barrier layer has a thickness from 10 Å to 30 Å. In an embodiment, the barrier layer includes silicon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a semiconductor substrate;
   a first channel region over the semiconductor substrate;
   a second channel region over the first channel region;
   gate dielectric layers surrounding the first channel region and the second channel region;
   work function metal layers surrounding the gate dielectric layers;
   barrier layers surrounding the work function metal layers, wherein a first barrier layer surrounding the first channel region is merged with a second barrier layer surrounding the second channel region, wherein the barrier layers comprise a material selected from silicon, silicon oxide, tantalum nitride, tungsten nitride, and tungsten carbonitride; and
   a conductive fill material on and in contact with a top surface of the second barrier layer, a side surface of the second barrier layer, and a side surface of the first barrier layer.

2. The semiconductor device of claim 1, wherein the work function metal layers comprise n-type work function metal layers.

3. The semiconductor device of claim 2, wherein the work function metal layers comprise titanium aluminum carbide.

4. The semiconductor device of claim 1, wherein the work function metal layers comprise p-type work function metal layers.

5. The semiconductor device of claim 1, wherein the work function metal layers comprise titanium nitride.

6. The semiconductor device of claim 1, wherein the material of the barrier layers is semiconductive or non-conductive.

7. The semiconductor device of claim 1, wherein the first barrier layer and the second barrier layer are conformal layers.

8. The semiconductor device of claim 1, wherein the barrier layers have thicknesses from 10 Å to 30 Å.

9. A semiconductor device comprising:
   a semiconductor substrate;
   a first channel region over and separated from the semiconductor substrate;
   a gate dielectric layer surrounding the first channel region;
   a work function metal layer surrounding the gate dielectric layer, wherein a thickness of the work function metal layer in a direction perpendicular to a major surface of the semiconductor substrate is equal to a thickness of the work function metal layer in a direction parallel to the major surface of the semiconductor substrate; and
   a barrier layer surrounding the work function metal layer, wherein the barrier layer comprises a semiconductive or non-conductive material.

10. The semiconductor device of claim 9, further comprising:
    a second gate dielectric layer on the semiconductor substrate;
    a second work function metal layer on the second gate dielectric layer; and
    a second barrier layer on the second work function metal layer, wherein the second barrier layer is merged with the barrier layer between the first channel region and the semiconductor substrate.

11. The semiconductor device of claim 9, further comprising:
    a second gate dielectric layer on the semiconductor substrate;
    a second work function metal layer on the second gate dielectric layer;
    a second barrier layer on the second work function metal layer; and
    a fill material surrounding the barrier layer and on the second barrier layer, wherein the fill material extends from the barrier layer and the second barrier layer between the first channel region and the semiconductor substrate.

12. The semiconductor device of claim 9, wherein the work function metal layer has a thickness from 10 Å to 40 Å.

13. The semiconductor device of claim 12, wherein the barrier layer has a thickness from 10 Å to 30 Å.

14. The semiconductor device of claim 9, wherein the barrier layer comprises silicon.

15. A semiconductor device comprising:
    a first channel region over a semiconductor substrate;
    a gate dielectric layer surrounding the first channel region;
    a first work function metal layer over the gate dielectric layer;
    a first barrier layer over the first work function metal layer, wherein the first barrier layer, the first work function metal layer, and the gate dielectric layer fill a space between the semiconductor substrate and the first channel region, wherein the first barrier layer comprises a semiconductive or non-conductive material selected from tantalum nitride, tungsten nitride, or tungsten carbonitride; and
    a conductive fill material over the first barrier layer, wherein the conductive fill material contacts a top surface and opposite side surfaces of the first barrier layer.

16. The semiconductor device of claim 15, wherein the first work function metal layer comprises titanium nitride, and wherein the first barrier layer comprises tantalum nitride.

17. The semiconductor device of claim 15, further comprising:
    a second channel region over a second region of the semiconductor substrate, wherein the first channel region is over a first region of the semiconductor substrate, wherein the gate dielectric layer surrounds the second channel region; and a second work function metal layer over the gate dielectric layer in the second region, the second work function metal layer comprising a second material different from a first material of the first work function metal layer.

18. The semiconductor device of claim 17, further comprising a second barrier layer over the second work function metal layer, the second barrier layer comprising a fourth material different from a third material the first barrier layer.

19. The semiconductor device of claim 18, wherein the conductive fill material further extends over the second barrier layer.

20. The semiconductor device of claim 17, further comprising a second barrier layer over the second work function metal layer, wherein the first barrier layer and the second barrier layer comprise a third material.

* * * * *